US011127662B2

(12) United States Patent
Matsuo et al.

(10) Patent No.: US 11,127,662 B2
(45) Date of Patent: Sep. 21, 2021

(54) SEMICONDUCTOR DEVICE

(71) Applicant: ROHM CO., LTD., Kyoto (JP)

(72) Inventors: Masaaki Matsuo, Kyoto (JP); Kenji Hayashi, Kyoto (JP); Akihiro Suzaki, Kyoto (JP); Soichiro Takahashi, Kyoto (JP); Masashi Hayashiguchi, Kyoto (JP); Yoshihisa Tsukamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 127 days.

(21) Appl. No.: 16/483,872

(22) PCT Filed: Mar. 14, 2018

(86) PCT No.: PCT/JP2018/009965
§ 371 (c)(1),
(2) Date: Aug. 6, 2019

(87) PCT Pub. No.: WO2018/168924
PCT Pub. Date: Sep. 20, 2018

(65) Prior Publication Data
US 2020/0013703 A1    Jan. 9, 2020

(30) Foreign Application Priority Data

Mar. 14, 2017  (JP) .............................. JP2017-048392
Mar. 14, 2017  (JP) .............................. JP2017-048393

(51) Int. Cl.
*H01L 23/495*  (2006.01)
*H01L 25/18*   (2006.01)
*H01L 23/04*   (2006.01)
*H01L 23/00*   (2006.01)

(52) U.S. Cl.
CPC ........ *H01L 23/49568* (2013.01); *H01L 23/04* (2013.01); *H01L 23/49575* (2013.01);
(Continued)

(58) Field of Classification Search
CPC . H01L 25/18; H01L 25/072; H01L 23/49575; H01L 23/49568; H01L 24/49; H01L 2224/49113; H01L 2224/73265
See application file for complete search history.

(56) References Cited

U.S. PATENT DOCUMENTS

2015/0194372 A1    6/2015  Ikeuchi

FOREIGN PATENT DOCUMENTS

JP    2002-368192 A    12/2002
JP    2010-178615 A     8/2010
(Continued)

OTHER PUBLICATIONS

International Search Report issued in PCT/JP2018/009965, dated Jun. 5, 2018 (1 page).

*Primary Examiner* — Thanhha S Pham
(74) *Attorney, Agent, or Firm* — Hamre, Schumann, Mueller & Larson, P.C.

(57) ABSTRACT

The disclosure provides a semiconductor device. The device includes first and second substrates, first mounting layers, second mounting layers, power supply terminals, an output terminal, electroconductive coupling members and switching elements. The first substrate has first obverse and reverse surfaces facing in a thickness direction. The second substrate has a second obverse surface facing as the first obverse surface faces in the thickness direction and a second reverse surface facing away from the second obverse surface. The second substrate is spaced from the first substrate in a first direction crossing the thickness direction. The first mounting layers are electrically conductive and disposed on the first obverse surface. The second mounting layers are electrically conductive and disposed on the second obverse surface. The power supply terminals are electrically connected to the first mounting layers. The output terminal is connected to one of the second mounting layers. The electroconductive coupling (Continued)

members are connected to the first and second mounting layers. The switching elements are mounted on the first and second mounting layers. Each of the electroconductive coupling members has strip sections and a connecting section. The strip sections extend in the first direction and are spaced in a second direction crossing the thickness direction and the first direction. The connecting section extends in the second direction to interconnect the strip sections. The strip sections are connected at one end to the first mounting layer and connected at another end to the second mounting layer.

17 Claims, 22 Drawing Sheets

(52) U.S. Cl.
CPC .............. *H01L 24/49* (2013.01); *H01L 24/73* (2013.01); *H01L 25/18* (2013.01); *H01L 2224/48137* (2013.01); *H01L 2224/49113* (2013.01); *H01L 2224/73265* (2013.01); *H01L 2924/13055* (2013.01)

(56) References Cited

FOREIGN PATENT DOCUMENTS

| | | |
|---|---|---|
| JP | 2016-162773 A | 9/2016 |
| WO | 2014/006814 A1 | 1/2014 |
| WO | WO-2016136418 A1 * | 9/2016 ............. H01L 25/18 |

* cited by examiner

SEMICONDUCTOR DEVICE

TECHNICAL FIELD

The present disclosure relates to a semiconductor device on which a plurality of switching elements are mounted.

BACKGROUND ART

JP-A-2002-368192 discloses an example of a semiconductor device having IGBTs as a plurality of switching elements. The semiconductor device has two insulating substrates. The switching elements on one of the insulating substrates constitute an upper arm circuit, and the switching elements on the other insulating substrates constitute a lower arm circuit. Wiring layers (copper pattern) are disposed on the two insulating substrates and electrically connected to the switching elements. The upper arm circuit and the lower arm circuit are electrically connected to each other via a plurality of wires connected to the wiring layers.

In recent years, there have been a growing demand for semiconductor devices capable of allowing large electric current to flow through for driving, for example, the motors of electric vehicles. The wiring layers disposed on the insulating substrates may be connected by wires. However, wires have a relatively small cross-sectional area, and such a semiconductor device is unsuitable for allowing the flow of large electric current.

To make the device suitable for allowing the flow of large electric current, the wiring layers may be connected not by wires but by electroconductive members, such as metal plates, which have a relatively large cross-sectional area. Unfortunately, the conductive members will have a larger area bonded to the wiring layers than the wires. In addition, as compared with the wiring layers and the conductive members, the insulating substrates have a smaller coefficient of linear expansion. Thus the insulating substrates will be subjected to thermal stress induced by heat from the switching elements. The thermal stress will be concentrated around each connection between a wiring layer and a conductive member. If the insulating substrates is repeatedly subjected to the concentration of thermal stress, cracking may occur in the insulating substrate.

SUMMARY OF THE INVENTION

In view of the above circumstances, the present disclosure aims to provide a semiconductor device capable of allowing a large electric current to flow and also reducing thermal stress concentration on the substrates.

The present disclosure provides a semiconductor device that includes a first substrate, a second substrate, a plurality of first mounting layers, a plurality of second mounting layers, a plurality of power supply terminals, an output terminal, a plurality of electroconductive coupling members and a plurality of switching elements. The first substrate has a first obverse surface and a first reverse surface each facing in a thickness direction. The second substrate has a second obverse surface facing in a direction in which the first obverse surface faces in the thickness direction and a second reverse surface facing away from the second obverse surface. The second substrate is spaced apart from the first substrate in a first direction perpendicular to the thickness direction. The plurality of first mounting layers are electrically conductive and disposed on the first obverse surface. The plurality of second mounting layers are electrically conductive and disposed on the second obverse surface. The plurality of power supply terminals are electrically connected to the plurality of first mounting layers. The output terminal is connected to one of the plurality of second mounting layers. The plurality of electroconductive coupling members are separately connected to the plurality of first mounting layers and to the plurality of second mounting layers. The plurality of switching elements are mounted on the plurality of first mounting layers and the plurality of second mounting layers. Each of the plurality of electroconductive coupling members has a plurality of strip sections and a connecting section. The plurality of strip sections extend in the first direction and are spaced apart from each other in a second direction perpendicular to both the thickness direction and the first direction. The connecting section extends in the second direction to interconnect the plurality of strip sections. The plurality of strip sections are connected at one end to the first mounting layer and connected at another end to the second mounting layer.

Other features and advantages of the present disclosure will be more apparent from the following detailed description given with reference to the accompanying drawings.

MODE FOR CARRYING OUT THE INVENTION

Modes for carrying out the present disclosure (hereinafter referred to as "embodiments") will be described below with reference to the accompanying drawings.

Figure 2:
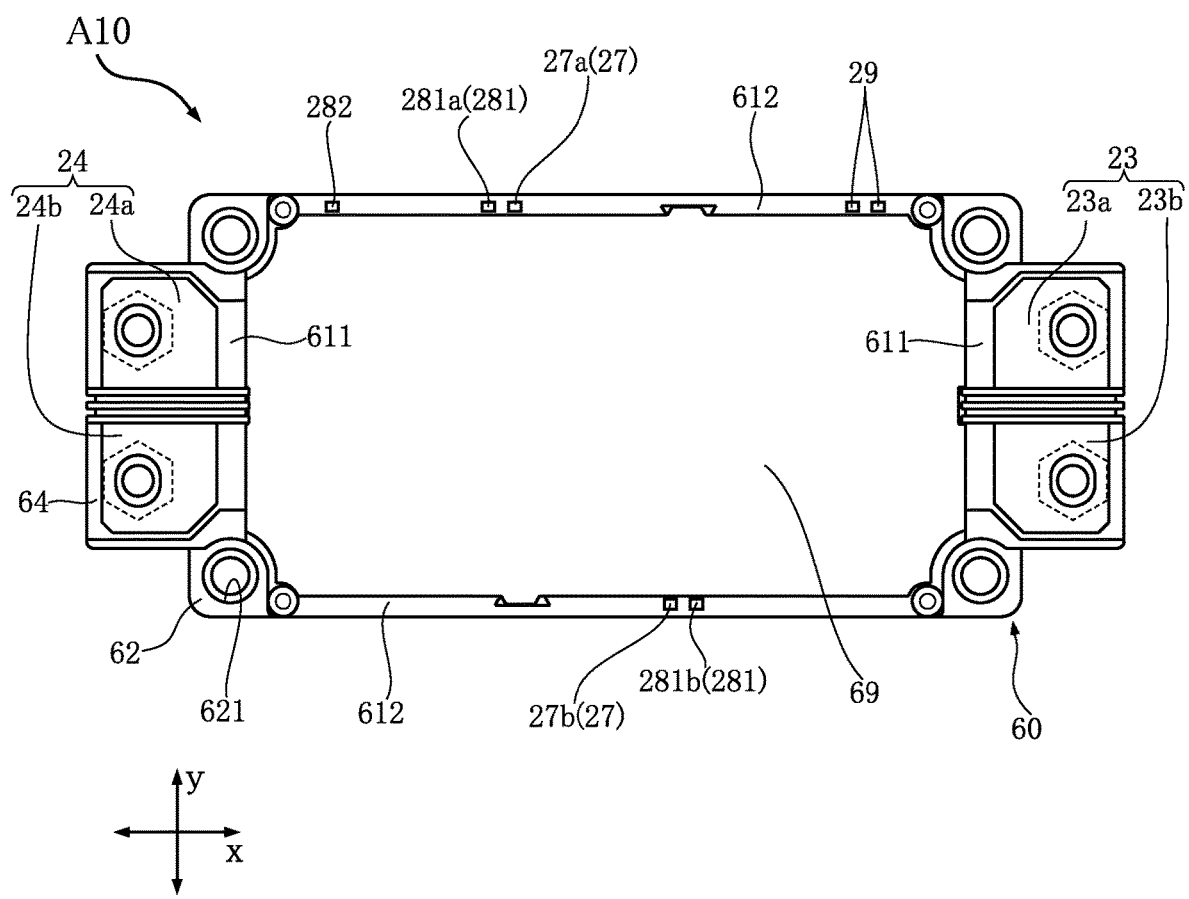
FIG. 2 is a plan view of the semiconductor device shown in FIG. 1.
Figure 3:
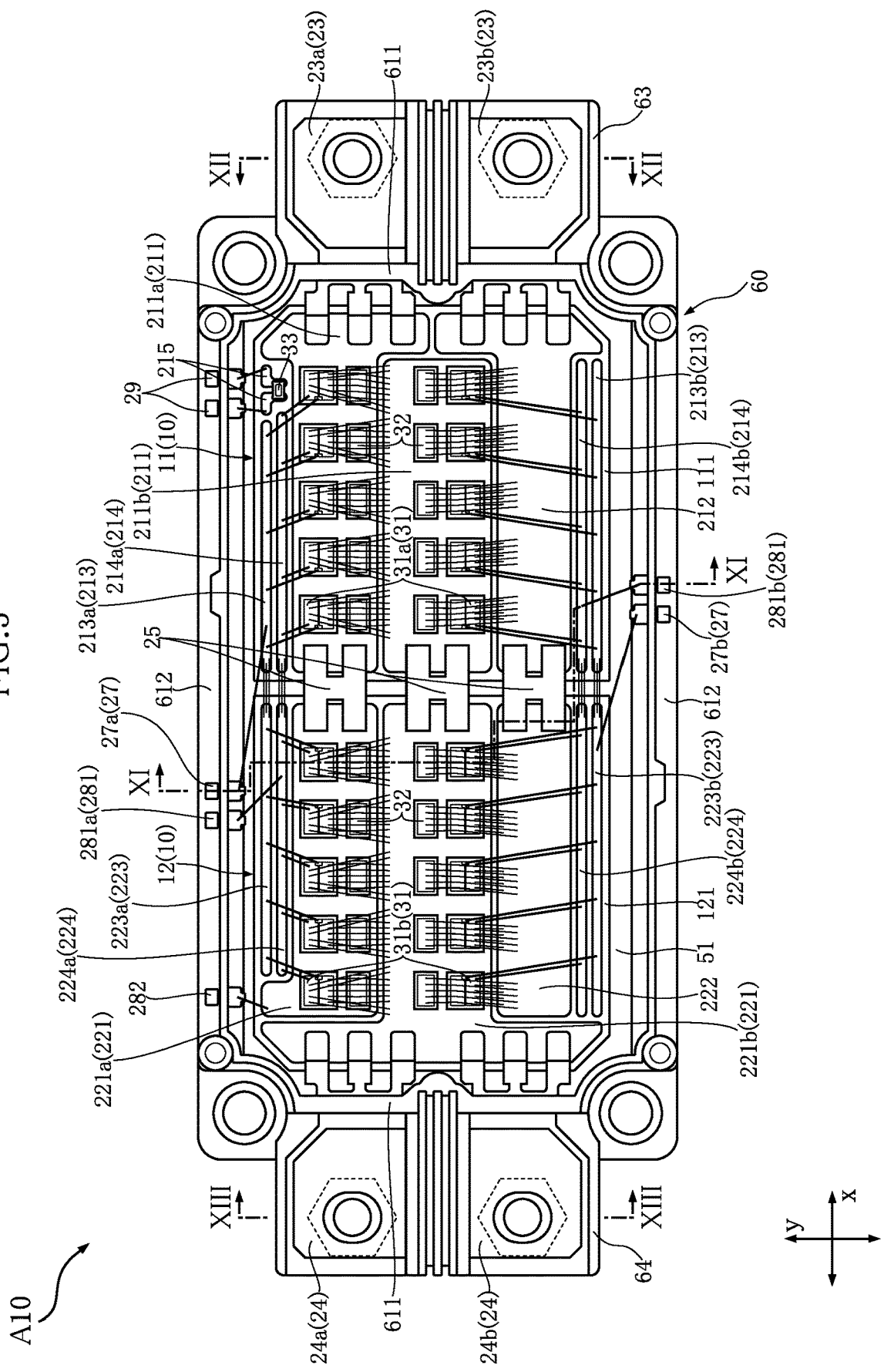
FIG. 3 is a plan view of the semiconductor device shown in FIG. 1 (with a top plate omitted).

With reference to FIGS. 1 to 20, a semiconductor device A10 according to an embodiment of the present disclosure will be described. The semiconductor device A10 includes substrates 10, first mounting layers 211, second mounting layers 221, power supply terminals 23, an output terminal 24, electroconductive coupling members 25 and switching elements 31. The semiconductor device A10 also includes a first electroconductive layer 212, first gate layers 213, first detection layers 214, a second electroconductive layer 222, second gate layers 223, second detection layers 224, first electroconductive members 261, second electroconductive members 262, gate terminals 27, element current detection terminals 281, diodes 32, a heatsink 51 and a case 60. In FIGS. 3 and 8 to 11, a top plate 69 is omitted for ease of understanding. FIG. 3 shows XI-XI line by a dash-dotted line.

Figure 1:
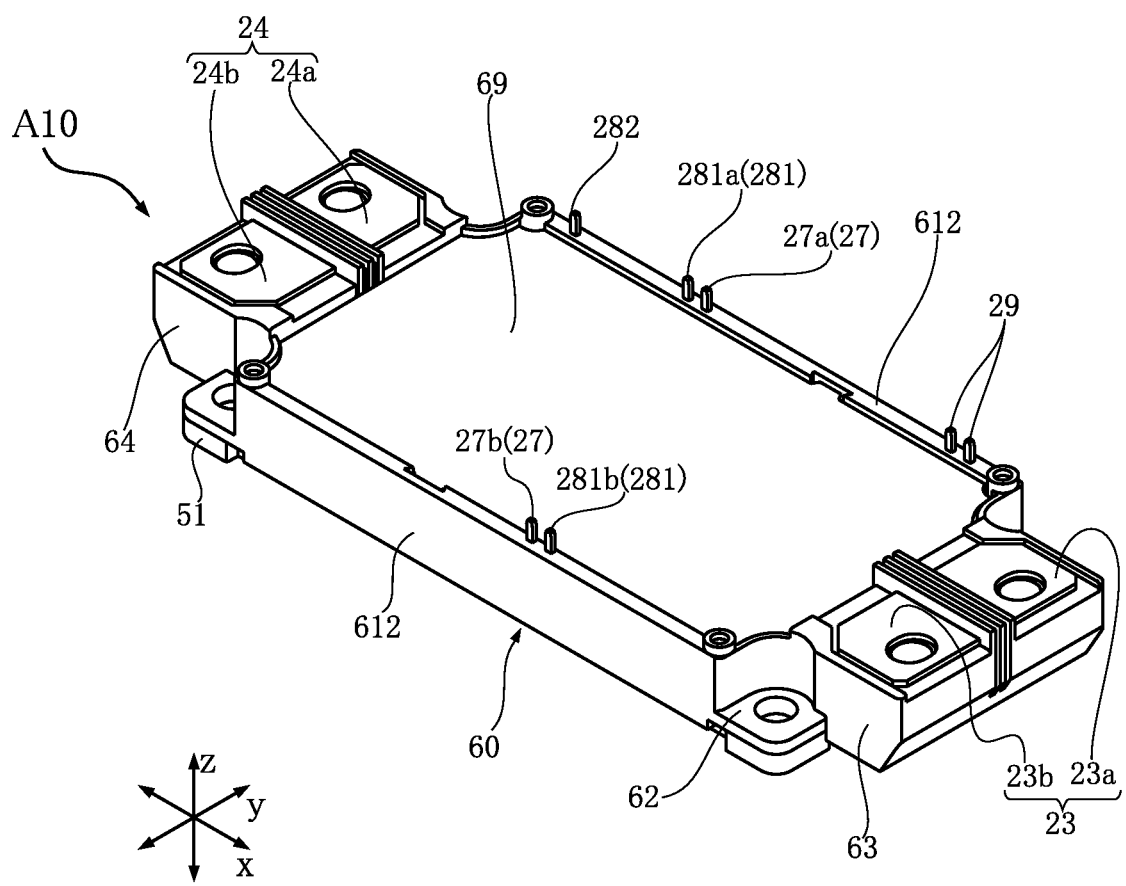
FIG. 1 is a perspective view of a semiconductor device according to one embodiment of the present disclosure.

The semiconductor device A10 shown in FIG. 1 is a power module. The semiconductor device A10 may be used for inverters of various electric products and hybrid vehicles. As shown in FIGS. 1 and 2, the semiconductor device A10 is substantially rectangular as viewed in a thickness direction z of the substrates 10 (hereinafter, simply "thickness direction z"). For ease of description, the direction perpendicular to the thickness direction z is defined as a first direction x. The direction perpendicular to both the thickness direction z and the first direction x is defined as a second direction y. The first direction x is the longitudinal direction of the semiconductor device A10.

Figure 10:
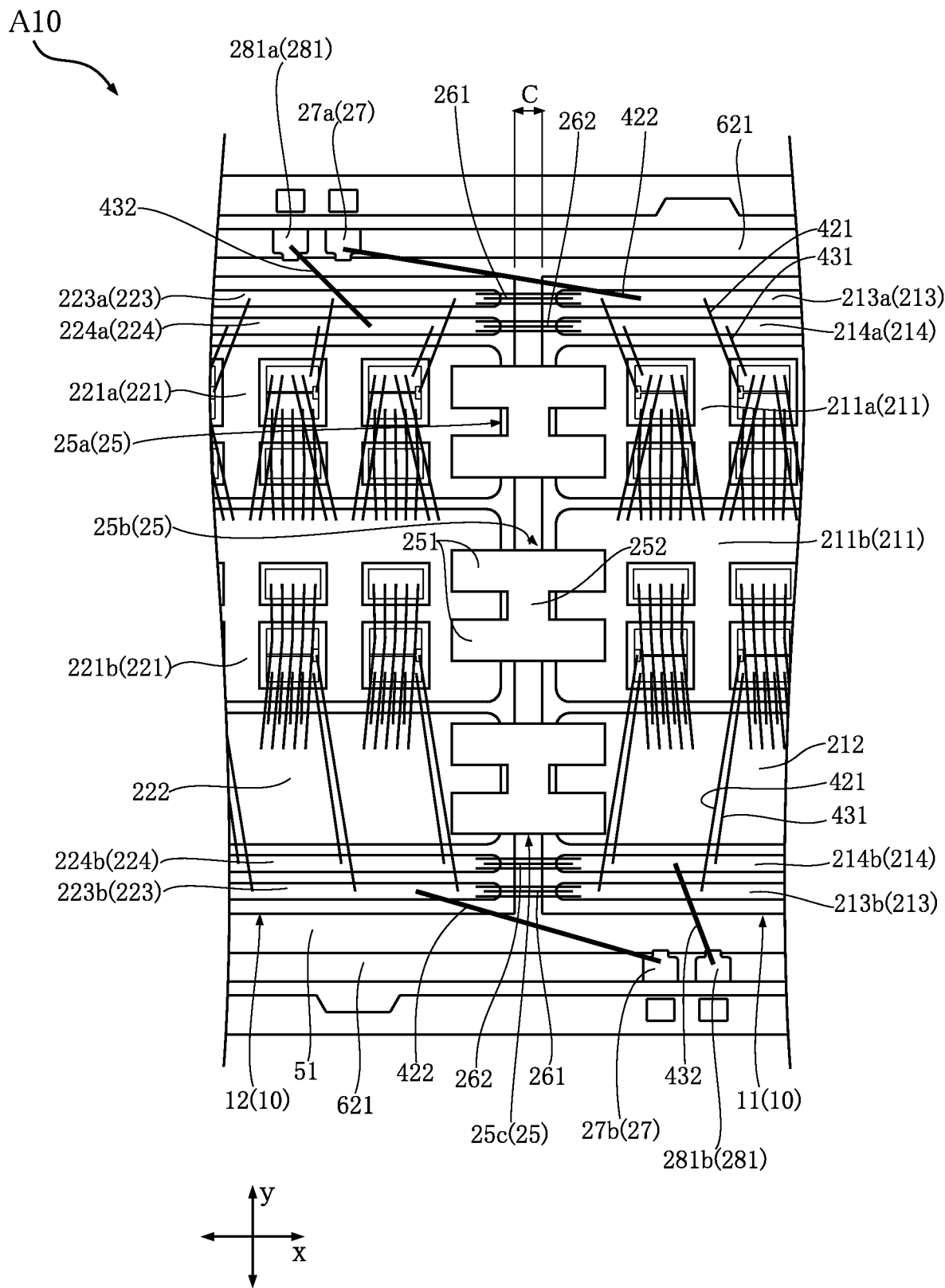
FIG. 10 is an enlarged view showing a central part of FIG. 3.
Figure 11:
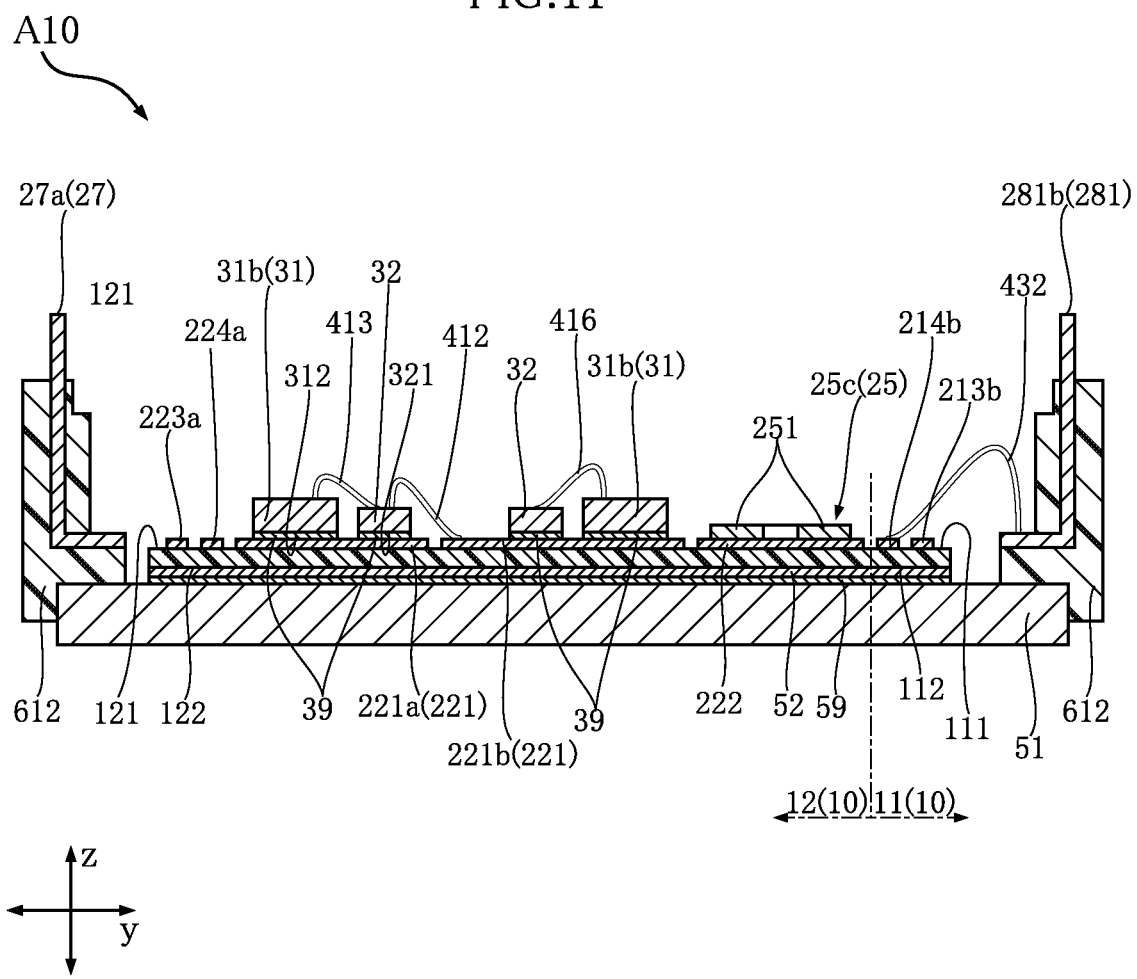
FIG. 11 is a sectional view taken along line XI-XI of FIG. 3.

As shown in FIG. 11, the substrates 10 are electrically insulating members supported on the heatsink 51. The substrates 10 of the semiconductor device A10 include two substrates, namely a first substrate 11 and a second substrate 12. The number of substrates 10 is not limited to such, and there may be three substrates, for example. The first substrate 11 has a first obverse surface 111 and a first reverse surface 112 each facing in the thickness direction z. The second substrate 12 has a second obverse surface 121 facing in the direction in which the first obverse surface 111 faces in the thickness direction z and also has a second obverse surface 122 facing away from the second obverse surface 121. The second substrate 12 is spaced apart from the first substrate 11 in the first direction x. That is, a gap C is provided between the first substrate 11 and the second substrate 12 in the first direction x, as shown in FIG. 10.

The materials for the first substrate 11 and the second substrate 12 include a ceramic material having an excellent thermal conductivity. On example of such a ceramic material is aluminum nitride (AlN). Both the first substrate 11 and the second substrate 12 may be DBC (direct bonding copper) substrates. A DBC substrate is a substrate containing aluminum nitride and having copper (Cu) foil directly bonded to the opposite surfaces of the substrate in the thickness direction z.

Figure 8:
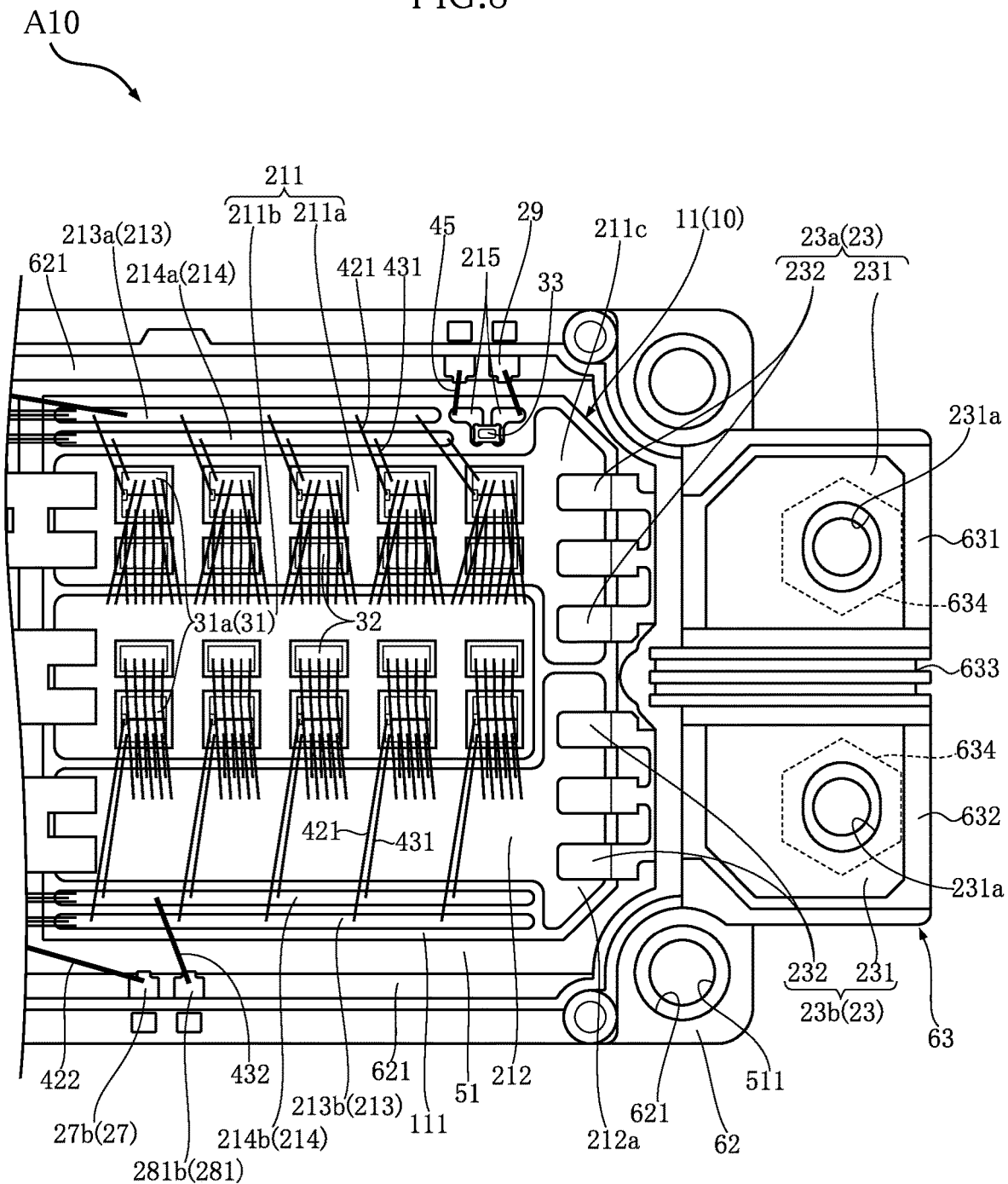
FIG. 8 is an enlarged view showing the right part (around a first substrate) of FIG. 3.

As shown in FIGS. 3 and 8, the first mounting layers 211, the first electroconductive layer 212, the first gate layers 213, the first detection layers 214 and a pair of thermistor mounting layers 215 are electroconductive components disposed on the obverse surface 111 of the first substrate 11. The materials for these electroconductive components include copper. When a DBC substrate is used as the first substrate 11, these electroconductive components can be readily formed by patterning copper foil bonded to the first obverse surface 111. These electroconductive components may be plated with silver (Ag).

As shown in FIG. 8, a plurality of switching elements 31 and a plurality of diodes 32 are mounted on the first mounting layers 211. For ease of description, the switching elements 31 mounted on the first mounting layers 211 are referred to as "first elements 31a". The first mounting layers 211 of the semiconductor device A10 include a first upper arm mounting layer 211a and a first lower arm mounting layer 211b.

As shown in FIG. 8, the first upper arm mounting layer 211a is located toward an edge of the first substrate 11 in the second direction y. The first upper arm mounting layer 211a has a strip shape extending in the first direction x. In the semiconductor device A10, five first elements 31a and five diodes 32 are mounted on the first upper arm mounting layer 211a. However, the numbers of components to be mounted are not limited to such. The first upper arm mounting layer 211a has a first power supply pad 211c at an end closer to the case 60 in the first direction x. The first power supply pad has a strip shape extending in the second direction y.

As shown in FIG. 8, the first lower arm mounting layer 211b is located between the first upper arm mounting layer 211a and the first electroconductive layer 212 in the second direction y. The first lower arm mounting layer 211b has a strip shape extending in the first direction x. In the semiconductor device A10, five first elements 31a and five diodes 32 are mounted on the first lower arm mounting layer 211b. However, the numbers of the components to be mounted are not limited to such.

As shown in FIG. 8, the first electroconductive layer 212 is electrically connected to the first elements 31a and the diodes 32 that are mounted on the first mounting layers 211. The first electroconductive layer 212 is located opposite the first upper arm mounting layer 211a across the first lower arm mounting layer 211b in the second direction y. The first electroconductive layer 212 has a strip shape extending in the first direction x. The first electroconductive layer 212 has a second power supply pad 212a at an end closer to the case 60 in the first direction x. The second power supply pad has a strip shape extending in the second direction y.

As shown in FIG. 8, the first gate layers 213 are electrically connected to the first elements 31a. The first gate layers 213 have a strip shape extending in the first direction x. The first gate layers 213 have a width (the dimension in the second direction y) that is smaller than the width of the first mounting layers 211 and the first electroconductive layer 212. The first gate layers 213 of the semiconductor device A10 include a first upper arm gate layer 213a and a first lower arm gate layer 213b.

As shown in FIG. 8, the first upper arm gate layer 213a is located between the first upper arm mounting layer 211a and the case 60 in the second direction y. Also as shown in FIG. 8, the first lower arm gate layer 213b is located between the first electroconductive layer 212 and the case 60 in the second direction y.

As shown in FIG. 8, the first detection layers 214 are electrically connected to the first elements 31a. The first detection layers 214 have a strip shape extending in the first direction x. The first detection layers 214 have a width (the dimension in the second direction y) that is equal to the width of the first gate layers 213. The first detection layers 214 of the semiconductor device A10 include a first upper arm detection layer 214a and a first lower arm detection layer 214b.

As shown in FIG. 8, the first upper arm detection layer 214a is located between the first upper arm mounting layer 211a and the first upper arm gate layer 213a in the second direction y. Also as shown in FIG. 8, the first lower arm detection layer 214b is located between the first electroconductive layer 212 and the first lower arm gate layer 213b in the second direction y.

As shown in FIG. 8, the pair of thermistor mounting layers 215 are spaced apart from each other in the first direction x to support a thermistor 33 thereon. The pair of thermistor mounting layers 215 are located at a corner of the first substrate 11. The first upper arm mounting layer 211a, the first upper arm gate layer 213a and the first upper arm detection layer 214a are located around the pair of thermistor mounting layer 215.

Figure 9:
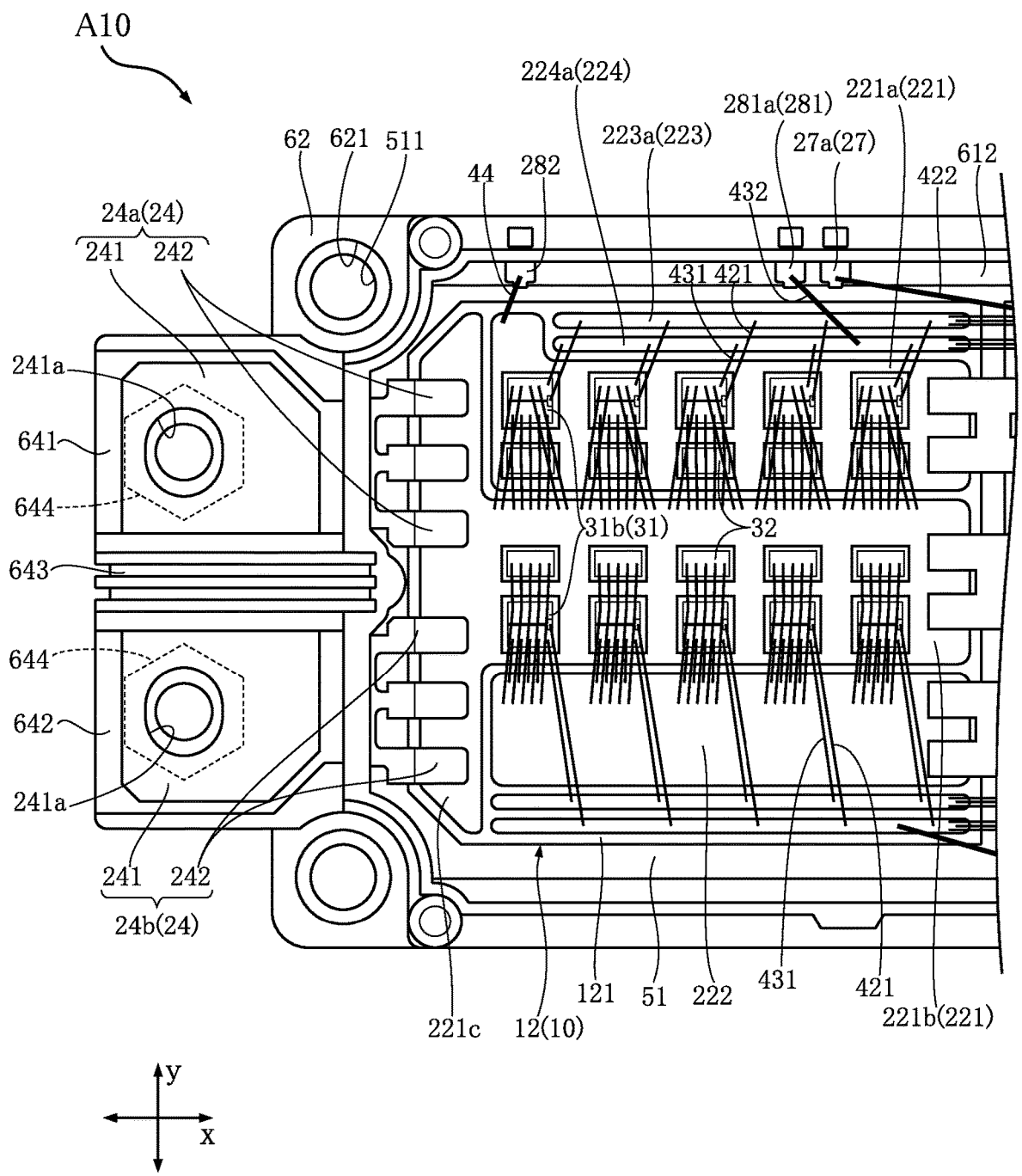
FIG. 9 is an enlarged view showing the left part (around a second substrate) of FIG. 3.

As shown in FIGS. 3 and 9, the second mounting layers 221, the second electroconductive layer 222, the second gate layers 223 and the second detection layers 224 are electroconductive components mounted on the second obverse surface 121 of the second substrate 12. The materials for these electroconductive components include copper. When a DBC substrate is used as the second substrate 12, these electroconductive components can be readily formed by patterning copper foil bonded to the second obverse surface 121. These electroconductive components may be plated with silver.

As shown in FIG. 9, a plurality of switching elements 31 and a plurality of diodes 32 are mounted on the second mounting layers 221. For ease of description, the switching elements 31 mounted on the second mounting layers 221 are referred to as "second elements 31b". The second mounting layers 221 of the semiconductor device A10 include a second upper arm mounting layer 221a and a second lower arm mounting layer 221b.

As shown in FIG. 9, the second upper arm mounting layer 221a is located toward an edge of the second substrate 12 in the second direction y. The second upper arm mounting layer 221a has a strip shape extending in the first direction x. In the semiconductor device A10, five second elements 31b and five diodes 32 are mounted on the second upper arm mounting layer 221a. However, the numbers of components to be mounted are not limited to such.

As shown in FIG. 9, the second lower arm mounting layer 221b has a part located between the second upper arm mounting layer 221a and the second electroconductive layer 222 in the second direction y. The second lower arm mounting layer 221b has a strip shape extending in the first direction x. In the semiconductor device A10, five second elements 31b and five diodes 32 are mounted on the second lower arm mounting layer 221b. However, the numbers of the components to be mounted are not limited to such. The second lower arm mounting layer 221b has an output pad 221c at an end closer to the case 60 in the first direction x. The output pad has a strip shape extending in the second direction y. On one side of the second lower arm mounting layer 221b in the second direction y, the output pad 221c has a part located adjacent to the second upper arm mounting layer 221a in the first direction x. On the other side of the second lower arm mounting layer 221b in the second direction y, the output pad 221c has a part located adjacent to the second electroconductive layer 222 in the first direction x.

As shown in FIG. 9, the second electroconductive layer 222 is electrically connected to the second elements 31b and the diodes 32 that are mounted on the second mounting layers 221. The second electroconductive layer 222 is located opposite the second upper arm mounting layer 221a across the second lower arm mounting layer 221b in the second direction y. The second electroconductive layer 222 has a strip shape extending in the first direction x.

As shown in FIG. 9, the second gate layers 223 are electrically connected to the second elements 31b. The second gate layers 223 have a strip shape extending in the first direction x. The second gate layers 223 have a width (the dimension in the second direction y) that is smaller than the width of the second mounting layers 221 and the second electroconductive layer 222. The second gate layers 223 of the semiconductor device A10 include a second upper arm gate layer 223a and a second lower arm gate layer 223b.

As shown in FIG. 9, the second upper arm gate layer 223a is located between the second upper arm mounting layer 221a and the case 60 in the second direction y. Also as shown in FIG. 9, the second lower arm gate layer 223b is located between the second electroconductive layer 222 and the case 60 in the second direction y.

As shown in FIG. 9, the second detection layers 224 are electrically connected to the second elements 31b. The second detection layers 224 have a strip shape extending in the first direction x. The second detection layers 224 have a width (the dimension in the second direction y) that is equal to the width of the second gate layers 223. The second detection layers 224 of the semiconductor device A10 include a second upper arm detection layer 224a and a second lower arm detection layer 224b.

As shown in FIG. 9, the second upper arm detection layer 224a is located between the second upper arm mounting layer 221a and the second upper arm gate layer 223a in the second direction y. Also as shown in FIG. 9, the second lower arm detection layer 224b is located between the second electroconductive layer 222 and the second lower arm gate layer 223b in the second direction y.

As shown in FIGS. 2 and 3, the power supply terminals 23 are a subset of external connection terminals provided in the semiconductor device A10. The power supply terminals 23 may be connected to a DC power supply that is external to the semiconductor device A10. The power supply terminals 23 are supported on the case 60. The power supply terminals 23 are composed of metal plates, which may be made of copper. The power supply terminals 23 have a thickness of 1.0 mm.

The power supply terminals 23 include a first power supply terminal 23a and a second power supply terminal 23b. The first power supply terminal 23a is the positive electrode (P-terminal). The first power supply terminal 23a is connected to the first power supply pad 211c of the first upper arm mounting layer 211a (one of the first mounting layers 211). The second power supply terminal 23b is the negative electrode (N-terminal). The second power supply terminal 23b is connected to the second power supply pad 212a of the first electroconductive layer 212. The first power supply terminal 23a and the second power supply terminal 23b are spaced apart from each other in the second direction y.

Figure 12:
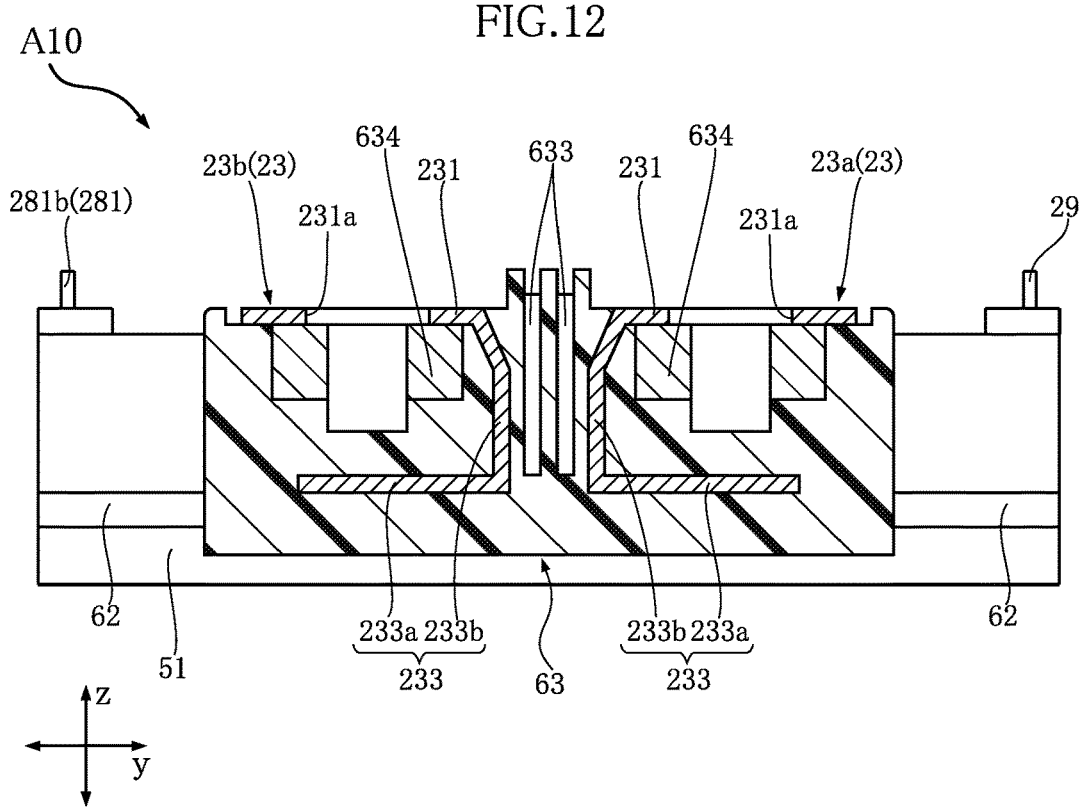
FIG. 12 is a sectional view taken along line XII-XII of FIG. 3.

As shown in FIGS. 8 and 12, each of the first power supply terminal 23a and the second power supply terminal 23b has an external connection part 231, an internal connection part 232 and an intermediate part 233.

Each of the external connection parts 231 is exposed from the semiconductor device A10 and has the shape of a flat plate perpendicular to the thickness direction z. The external connection part 231 may be connected to a cable of a DC power supply, for example. The external connection part 231 is supported on the case 60. The external connection part 231 has a connecting hole 231a, which is a through hole extending in the thickness direction z. A fastening member such as a bolt is inserted into the connecting hole 231a. The external connection part 231 may be plated with nickel (Ni).

Each of the internal connection parts 232 is in the shape of a comb having teeth. The internal connection part of the first power supply terminal 23a is connected to the first power supply pad 211c of the first upper arm mounting layer 211a. The internal connection part of the second power supply terminal 23b is connected to the second power supply pad 212a of the first electroconductive layer 212. In the semiconductor device A10, each internal connection part 232 has three teeth arranged along the second direction y. The teeth have been bent in the thickness direction z to have a hooked shape as viewed in the second direction y. The teeth are connected to the first power supply pad 211c and the second power supply pad 212a by ultrasonic bonding.

Each of the intermediate parts 233 interconnects the external connection part 231 and the internal connection part 232. The intermediate part 233 has an L-shape in a section perpendicular to the first direction x. The intermediate part 233 has a base part 233a and a standing part 233b. The base part 233a is oriented along the first direction x and the second direction y. One end of the base part 233a in the first direction x is connected to the internal connection part 232. The standing part 233b is raised from the base part 233a in the thickness direction z. One end of the standing part 233b in the thickness direction z is connected to the external connection part 231.

As shown in FIGS. 2 and 3, the output terminal 24 is one of the external connection terminals provided in the semiconductor device A10. The output terminal 24 may be connected to a power supply target (such as a motor) that is external to the semiconductor device A10. The output terminal 24 is supported on the case 60 and located opposite the power supply terminals 23 across the first substrate 11 and the second substrate 12 in the first direction x. The output terminal 24 are composed of metal plates, which may be made of copper. The output terminal 24 has a thickness of 1.0 mm.

The output terminal 24 of the semiconductor device A10 is divided into two parts, namely a first terminal part 24a and a second terminal part 24b. Unlike the semiconductor device A10, however, the output terminal 24 may be a single undivided piece. The first terminal part 24a and the second terminal part 24b are connected in parallel to the output pad 221c of the second lower arm mounting layer 221b (one of the second mounting layers 221). Thus, the output terminal 24 is connected to one of the second mounting layers 221.

The first terminal part 24a and the second terminal part 24b are spaced apart from each other in the second direction y.

Figure 13:
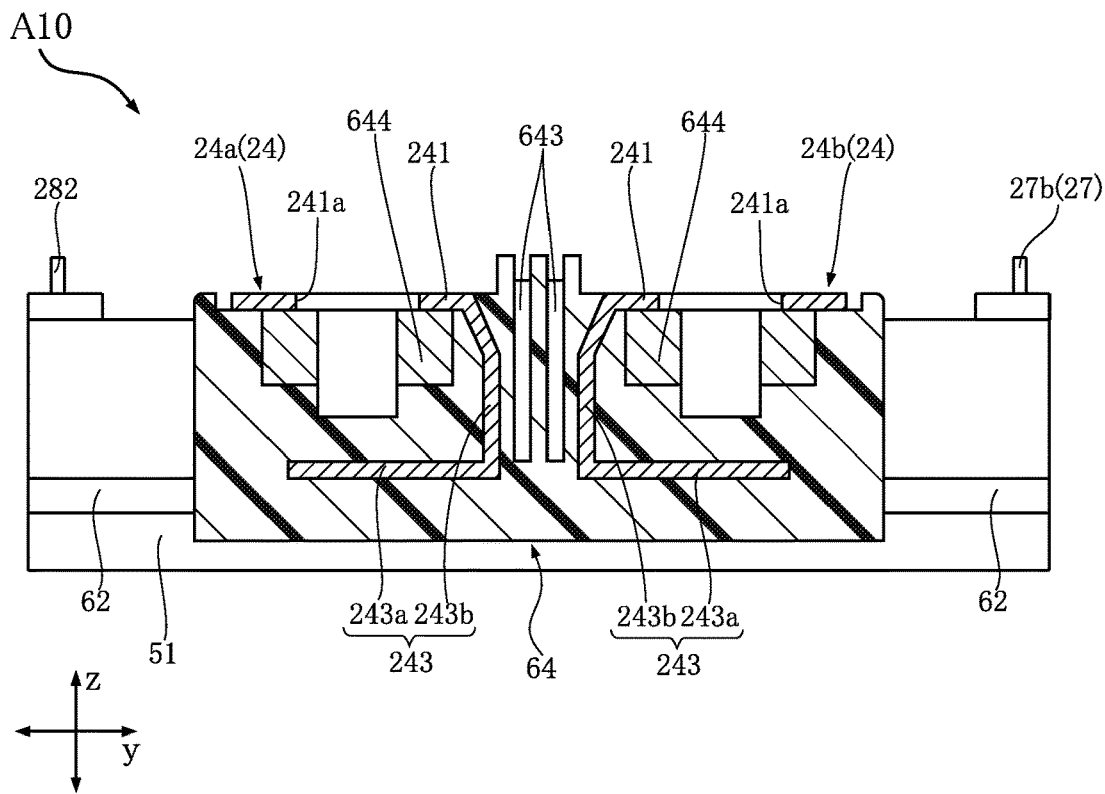
FIG. 13 is a sectional view taken along line XIII-XIII of FIG. 3.

As shown in FIGS. 9 and 13, each of the first terminal part 24a and the second terminal part 24b has an external connection part 241, an internal connection part 242 and an intermediate part 243.

Each of the external connection parts 241 is exposed from the semiconductor device A10 and has the shape of a flat plate perpendicular to the thickness direction z. The external connection part 241 may be connected to a cable electrically connected to a power supply target. The external connection part 241 is supported on the case 60. The external connection part 241 has a connecting hole 241a, which is a through hole extending in the thickness direction z. A fastening member such as a bolt is inserted into the connecting hole 241a. The external connection part 231 may be plated with nickel.

Each internal connection part 242 is in the shape of a comb having teeth connected to the output pad 221c of the first lower arm mounting layer 211b. In the semiconductor device A10, each internal connection part 232 has three teeth arranged along the second direction y. The teeth have been bent in the thickness direction z to have a hooked shape as viewed in the second direction y. The teeth are connected to the output pad 221c by ultrasonic bonding.

Each of the intermediate parts 243 interconnects the external connection part 241 and the internal connection part 242. The intermediate part 243 has an L-shape in a section perpendicular to the first direction x. The intermediate part 243 has a base part 243a and a standing part 243b. The base part 243a is oriented along the first direction x and the second direction y. One end of the base part 243a in the first direction x is connected to the internal connection part 242. The standing part 243b is raised from the base part 243a in the thickness direction z. One end of the standing part 243b in the thickness direction z is connected to the external connection part 241.

As shown in FIGS. 3 and 10, the electroconductive coupling members 25 are electroconductive members each connected to the first mounting layer 211 and the second mounting layer 221 or connected to the first electroconductive layer 212 and the second electroconductive layer 222. The electroconductive coupling members 25 have the shape of a flat plate perpendicular to the thickness direction z. The electroconductive coupling members 25 are composed of metal plates, which may be made of copper. The electroconductive coupling members 25 have a thickness of 0.3 to 0.5 mm. That is, the thickness of the electroconductive coupling members 25 is smaller than the respective thicknesses of the power supply terminals 23 and the output terminal 24.

As shown in FIG. 10, the electroconductive coupling members 25 include a first member 25a, a second member 25b and a third member 25c. The first member 25a connects the first upper arm mounting layer 211a (one of the first mounting layers 211) and the second upper arm mounting layer 221a (one of the second mounting layers 221) across the gap C, thereby providing electrical continuity between the first upper arm mounting layer 211a and the second upper arm mounting layer 221a. The second member 25b connects the first lower arm mounting layer 211b (one of the first mounting layers 211) and the second lower arm mounting layer 221b (one of the second mounting layers 221) across the gap C, thereby providing electrical continuity between the first lower arm mounting layer 211b and the second lower arm mounting layer 221b. The third member 25c connects the first electroconductive layer 212 and the second electroconductive layer 222 across the gap C, thereby providing electrical continuity between the first electroconductive layer 212 and the second electroconductive layer 222. The first member 25a, the second member 25b and the third member 25c are arranged along the second direction y.

Figure 14:
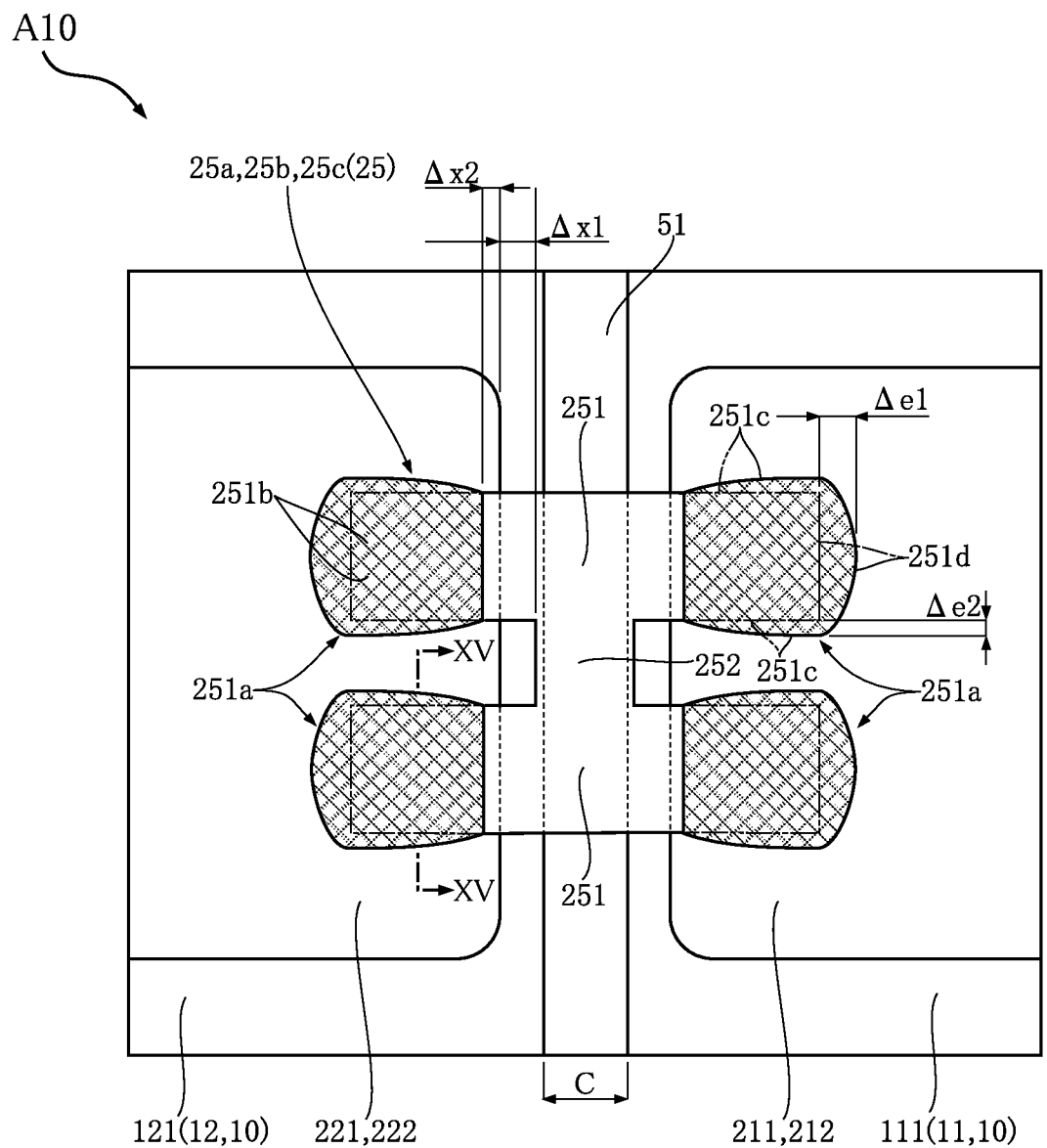
FIG. 14 is an enlarged view showing a part (around an electroconductive coupling member) of FIG. 10.

As shown in FIG. 14, each of the first member 25a, the second member 25b and the third member 25c has strip sections 251 and a connecting section 252. The strip sections 251 extend in the first direction x, and the strip sections 251 are spaced apart from each other in the second direction y. Although the number of strip sections 251 provided in the semiconductor device A10 is two, the number of the strip sections 251 is not limited to such. The connecting section 252 extends in the second direction y, and the connecting section 252 interconnects the strip sections 251.

As shown in FIG. 14, for the first member 25a and the second member 25b, the strip sections 251 are connected at one end to the first mounting layer 211, and the strip sections 251 are connected at the other ends to the second mounting layer 221. For the third member 25c, the strip sections 251 are connected at one end to the first electroconductive layer 212, and the strip sections 251 are connected at the other ends to the second electroconductive layer 222.

For the first member 25a and the second member 25b of the semiconductor device A10, ultrasonic bonding is used to connect the strip sections 251 to the first mounting layers 211 and the second mounting layers 221. For the third member 25c of the semiconductor device A10, ultrasonic bonding is used to connect the strip sections 251 to the first electroconductive layer 212 and the second electroconductive layer 222. As shown in FIG. 14, each strip section 251 has a pair of connection regions 251a. The pair of connection regions 251a are located at the opposite ends of the strip section 251 in the first direction x. One of the connection regions 251a of the strip section 251 is the part bonded to one of the first mounting layers 211 and the first electroconductive layer 212. The other connection region 251a of the strip section 251 is the part bonded to one of the second mounting layer 221 and the second electroconductive layer 222.

As shown in FIG. 14, each of the connection regions 251a has a pair of first edges 251c and a second edge 251d as viewed in the thickness direction z. The pair of first edges 251c are spaced apart from each other in the second direction y. The second edge 251d meets one end of each first edge 251c in the first direction x. In FIG. 14, the first edges 251c and the second edges 251d before the ultrasonic bonding are represented by phantom lines (chain double-dashed lines). Each first edge 251c after the ultrasonic bonding bulges in the second direction y by a maximum distance Δe2 relative to the initial first edge 251c. The second edge 215d after the ultrasonic bonding bulges in the first direction x by a maximum distance Δe1 relative to the initial second edge 215d. The maximum distance Δe1 is greater than the maximum distance Δe2. The first edges 251c and the second edge 251d bulging out as described above are achieved through the ultrasonic bonding using ultrasonic vibrations in the second direction y.

Figure 15:
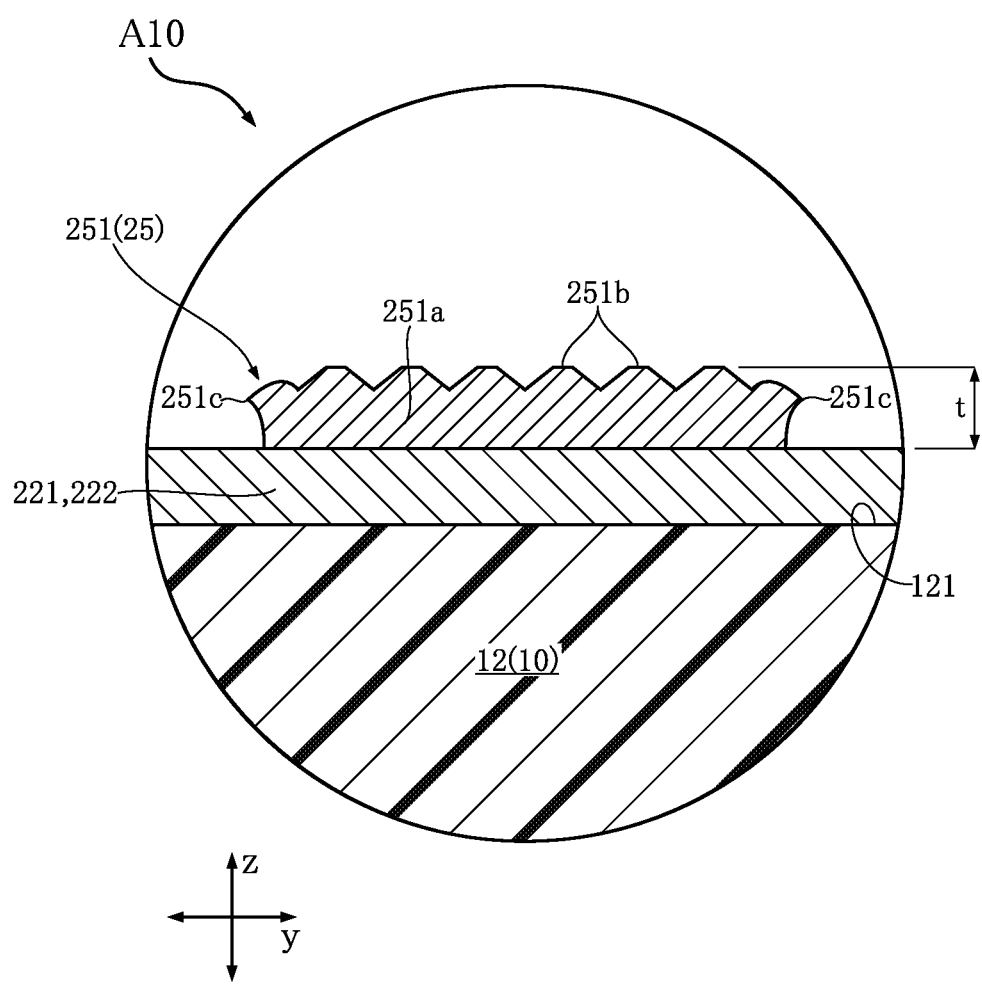
FIG. 15 is a sectional view taken along line XV-XV of FIG. 14.

FIG. 15 shows a connection region 251a bonded to one of the second mounting layers 221 and the second electroconductive layer 222. In the connection region, the upper face, which has the pair of edges 251c, is larger in the second direction y than the lower face that is in contact with the second mounting layer 221 or the second electroconductive layer 222. That is, the opposite ends of the connection region 251a in the second direction y are tapered in the range between the lower surface and the upper surface. Likewise, the connection region 251a is tapered between the ends in the first direction x.

As shown in FIG. 14, each strip section 251 has a pair of first regions Δx1 and a pair of second regions Δx2. As viewed in the thickness direction z, each first region Δx1 overlaps with one of the first substrate 11 and the second substrate 12. As viewed in the thickness direction z, each first region Δx1 is located between an edge of the connecting section 252 and an edge of one of the first mounting layers 211, the second mounting layers 221, the first electroconductive layer 212 and the second electroconductive layer 222. As viewed in the thickness direction, each second regions Δx2 overlaps with one of the first mounting layers 211, the second mounting layers 221, the first electroconductive layer 212 and the second electroconductive layer 222. Each second region Δx2 is located between the first region Δx1 and the connection region 251a. The dimension of each first region Δx1 in the first direction x is larger than the dimension of each second region Δx2 in the first direction x. The second regions Δx2 are provided as allowances to facilitate the formation of the connection regions 251a in the strip sections 251 by ultrasonic bonding. The dimension of the second regions Δx2 in the first direction x is 0.5 mm for example.

As shown in FIGS. 14 and 15, each connection region 251a has a plurality of projections 251b on the surface. As viewed in the thickness direction z, the projections 251b are arranged in a mesh pattern. The projections 251b extends in the thickness direction z from the connection region 251a. The strip section 251 has a thickness t of 0.3 mm at an end where the thickness is of the connection region 251a including the projections 251b.

Figure 16:
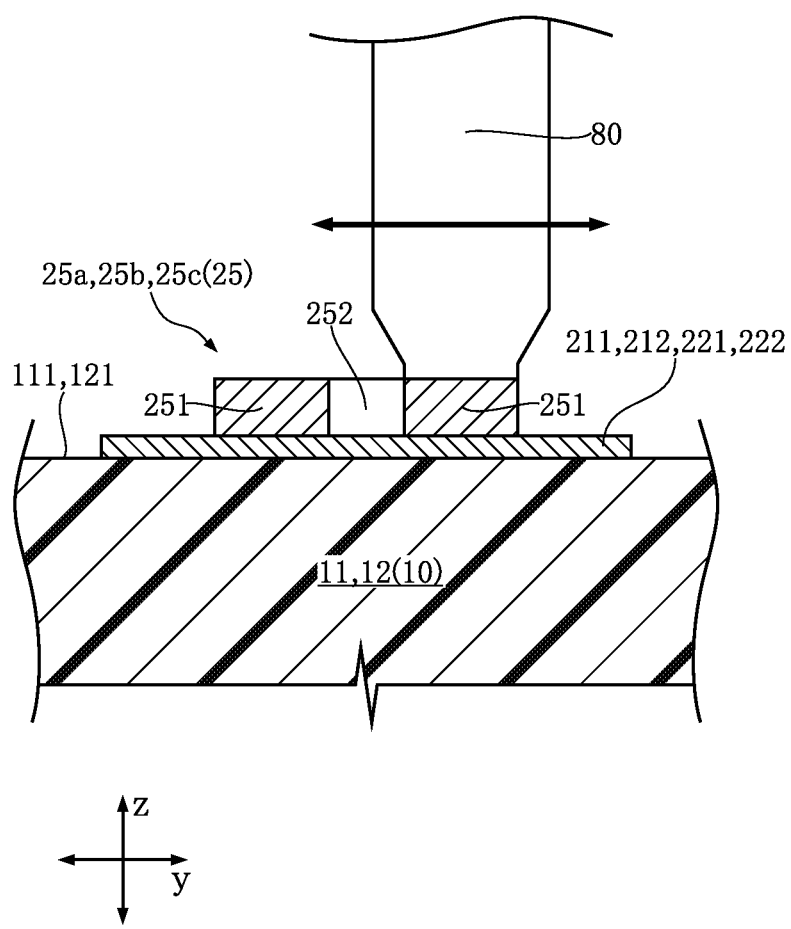
FIG. 16 is a sectional view illustrating a process of connecting the electroconductive coupling member shown in FIG. 14.

With reference to FIG. 16, the following describes a process of connecting the electroconductive coupling members 25 by ultrasonic bonding. FIG. 16 shows ends of the strip sections 251 in the first direction x that are in contact with one of the first mounting layers 211, the second mounting layers 221, the first electroconductive layer 212 and the second electroconductive layer 222. In this state, the ends are subjected to compressive load in the thickness direction z using a capillary 80. Then, the capillary 80 is caused to generate ultrasonic vibrations in the second direction y and at frequencies of 20 to 60 kHz. Through this process, the connection regions 251a having projections 251 are formed at the ends. In addition, since the compressive load is applied by the capillary 80 in the thickness direction z, the processed ends will have a thickness t (the thickness t of the connection region 251a including the projections 251b as shown in FIG. 15) that is smaller than the thicknesses of the rest of the strip section 251. The shape of the projections 251b, which depends on the shape of the capillary 80 at the part contacting the connection region 251a, is not specifically limited. In the example of FIGS. 14 and 15, the projections 251b are formed in a grid pattern made of lines inclined relative to both the first direction x and the second direction y. By the pair of connection regions 251a and the projections 251b thus formed, the ends are bonded to the one of the first mounting layers 211, the second mounting layers 221, the first electroconductive layer 212 and the second electroconductive layer 222. Likewise, the internal connection parts 232 of the power supply terminals 23 and the internal connection parts 242 of the output terminal 24 described earlier may be bonded to their targets by applying ultrasonic vibrations in the second direction y as shown in FIG. 16 to the respective teeth.

As shown in FIG. 10, the first electroconductive members 261 are electroconductive components extending across the gap C to be separately connected to the first gate layers 213 and to the second gate layers 223. Thus, the first upper arm gate layer 213a and the second upper arm gate layer 223a are electrically connected to each other, and the first lower arm gate layer 213b and the second lower arm gate layer 223b are electrically connected to each other. In the semiconductor device A10, each first electroconductive component 261 is composed of a plurality of metal wires, and the metal may be aluminum (Al). All of the first electroconductive members 261 extend in the first direction x.

As shown in FIG. 10, the second electroconductive members 262 are electroconductive components extending across the gap C to be separately connected to the first detection layers 214 and to the second detection layers 224. Thus, the first upper arm detection layer 214a and the second upper arm detection layer 224a are electrically connected to each other, and the first lower arm detection layer 214b and the second lower arm detection layer 224b are electrically connected to each other. In the semiconductor device A10, each second electroconductive component 262 is composed of a plurality of metal wires, and the metal may be aluminum. All of the second electroconductive members 262 extend in the first direction x.

Figure 4:
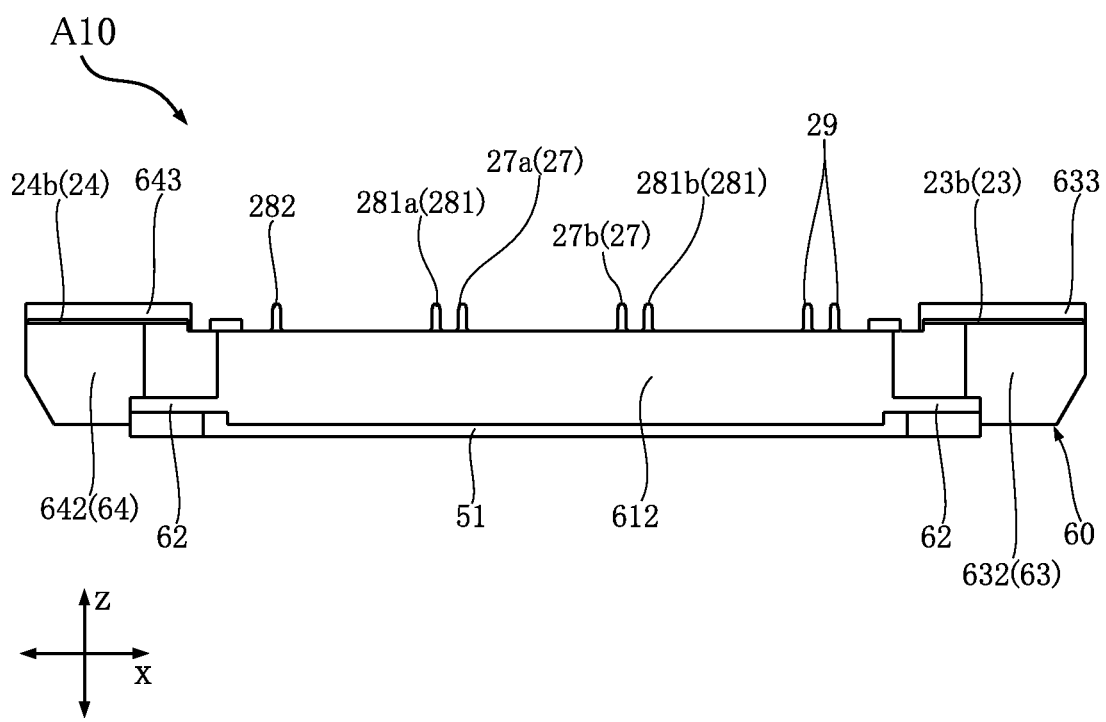
FIG. 4 is a front view of the semiconductor device shown in FIG. 1.

As shown in FIGS. 2 to 4, the gate terminals 27 are a subset of the external connection terminals provided in the semiconductor device A10. The gate terminals 27 are each electrically connected to one of the first gate layers 213 and the second gate layers 223. The gate terminals 27 are connected to a driving circuit (such as a gate driver) that is external to the semiconductor device A10. The gate terminals 27 are supported on the case 60. The gate terminals 27 are composed of metal rods, and the metal rods may be made of copper. The gate terminals 27 may be plated with tin (Sn) or with nickel and tin. As shown in FIG. 11, the gate terminals 27 have an L-shape in a section perpendicular to the first direction x. Each gate terminal 27 has a part protruding out of the case 60 in the direction in which the first obverse surface 111 of the first substrate 11 faces in the thickness direction z.

The gate terminals 27 include a first gate terminal 27a and a second gate terminal 27b. As shown in FIG. 10, the first gate terminal 27a is in proximity to the second upper arm gate layer 223a in the second direction y. As shown in FIG. 10, the second gate terminal 27b is located at the side opposite the first gate terminal 27a in the second direction y, across the first substrate 11 and the second substrate 12. The second gate terminal 27b is in proximity to the first lower arm gate layer 213b.

As shown in FIGS. 2 to 4, the element current detection terminals 281 are a subset of the external connection terminals provided in the semiconductor device A10. The element current detection terminals 281 are each electrically connected to one of the first detection layers 214 and the second detection layers 224. The element current detection terminals 281 are connected to a control circuit that is external to the semiconductor device A10. The element current detection terminals 281 are supported on the case 60. The element current detection terminals 281 are composed of metal rods, and the metal rods may be made of copper. The element current detection terminals 281 may be plated with tin or with nickel and tin. As shown in FIG. 11, the gate terminals 27 have an L-shape in a section perpendicular to the first direction x. Each element current detection terminal 281 has a part protruding out of the case 60 in the direction in which the first obverse surface 111 of the first substrate 11 faces in the thickness direction z.

The element current detection terminals 281 include a first detection terminal 281a and a second detection terminal 281b. As shown in FIG. 10, the first detection terminal 281a is adjacent to the first gate terminal 27a in the first direction x. As shown in FIG. 10, the second detection terminal 281b is adjacent to the second gate terminal 27b in the first direction x.

As shown in FIGS. 2 to 4 and 9, the semiconductor device A10 includes a source current detection terminal 282. The source current detection terminal 282 is one of the external connection terminals provided in the semiconductor device A10. The source current detection terminal 282 is connected to a control circuit external to the semiconductor device A10. The source current detection terminal 282 is supported on the case 60. The source current detection terminal 282 is composed of a metal rod, and the metal rod may be made of copper. The source current detection terminal 282 may be plated with tin or with nickel and tin. The source current detection terminal 282 is identical in shape to the gate terminals 27 shown in FIG. 11. Similarly to the gate terminals 27 shown in FIG. 11, the source current detection terminal 282 has a part protruding out of the case 60 in the direction in which the first obverse surface 111 of the first substrate 11 is facing. In the second direction y, the source current detection terminal 282 is at the same position as the first gate terminal 27a. The source current detection terminal 282 is spaced apart from the first gate terminal 27a in the first direction x toward the first terminal part 24a (output terminal 24).

As shown in FIG. 9, the semiconductor device A10 includes a source current detection wire 44. The source current detection wire 44 is an electroconductive component connecting the element current detection terminal 281 to one of the first upper arm mounting layer 211a and the second upper arm mounting layer 221a. In the semiconductor device A10, the source current detection wire 44 is connected at one end to the second upper arm mounting layer 221a. Thus, the element current detection terminal 281 is electrically connected to the second upper arm mounting layer 221a and the first upper arm mounting layer 211a. The source current detection wire 44 may be made of aluminum.

As shown in FIGS. 2 to 4 and 8, the semiconductor device A10 includes a pair of thermistor terminals 29. The pair of thermistor terminals 29 are a subset of the external connection terminals provided in the semiconductor device A10. The pair of thermistor terminals 29 are connected to a control circuit external to the semiconductor device A10. The pair of thermistor terminals 29 are supported on the case 60. The pair of thermistor terminals 29 are composed of metal rods, and the metal rods may be made of copper. The pair of thermistor terminals 29 may be plated with tin or with nickel and tin. The pair of thermistor terminals 29 are identical in shape to the gate terminals 27 shown in FIG. 11. Similarly to the gate terminals 27 shown in FIG. 11, each thermistor terminals 29 has a part protruding out of the case 60 in the direction in which the first obverse surface 111 of the first substrate 11 is facing. In the second direction y, the pair of thermistor terminals 29 are located at the same position as the first gate terminal 27a. The pair of thermistor terminals 29 are spaced apart from the first gate terminal 27a in the first direction x toward the first power supply terminal 23a. The pair of thermistor terminals 29 are spaced apart from each other in the first direction x.

As shown in FIG. 8, the semiconductor device A10 includes a pair of thermistor wires 45. The pair of thermistor wires 45 are electroconductive components separately connected to the pair of thermistor terminals 29 and to the pair of thermistor mounting layers 215. Thus, the pair of source current detection terminals 282 are electrically connected to the pair of thermistor mounting layers 215. The pair of thermistor wires 45 may be made of aluminum.

As shown in FIG. 3, the switching elements 31 (the first elements 31a and the second elements 31b) are semiconductor elements mounted on the first mounting layers 211 and the second mounting layers 221. The switching elements 31 on the first mounting layer 211 and the second mounting layer 221 are arranged along the first direction x. The switching elements 31 are IGBTs (insulated gate bipolar transistors) mainly composed of silicon (Si) or silicon carbide (SiC). Alternatively, the switching elements 31 may be MOSFETs (metal-oxide-semiconductor field-effect transistors). The description of the semiconductor device A10 relates to a case where the switching elements 31 are IGBTs.

As shown in FIGS. 11 and 17 to 20, each switching element 31 includes a first electrode 311, a second electrode 312 and a gate electrode 313.

As shown in FIGS. 17 to 20, each first electrode 311 is disposed on the upper face of the switching element 31, the upper face facing in the direction in which the first obverse surface 111 of the first substrate 11 (or the second obverse surface 121 of the second substrate 12) faces in the thickness direction z. The emitter current of the switching element 31 flows out through the first electrode 311. In the semiconductor device A10, the first electrode 311 has a pair of regions spaced apart in the second direction y.

As shown in FIG. 11, each second electrode 312 is disposed on the lower face of the switching element 31, the lower face facing opposite to the direction in which the first obverse surface 111 of the first substrate 11 (or the second obverse surface 121 of the second substrate 12) faces in the thickness direction z. The collector current flows into the switching element 31 through the second electrode 312.

Each second electrode 312 is electrically connected to one of the first mounting layers 211 and the second mounting layers 221 via an electroconductive bonding layer 39. That is to say, the second electrode 312 of each switching element 31 is electrically connected to one of the first mounting layers 211 and the second mounting layers 221. The material of the electroconductive bonding layers 39 may be lead-free solder mainly composed of tin.

As shown in FIGS. 17 to 20, each gate electrode 313 is disposed on the upper face of the switching element 31, the upper face facing in the direction in which the first obverse surface 111 of the first substrate 11 (or the second obverse surface 121 of the second substrate 12) faces in the thickness direction z. In the semiconductor device A10, the gate electrode 313 is located between the pair of regions of the first electrode 311 in the second direction y. The gate voltage for driving the switching element 31 is applied to the gate electrode 313. As viewed in the thickness direction z, the gate electrode 313 is smaller in area than the first electrode 311.

As shown in FIG. 3, the diodes 32 are mounted on the first mounting layers 211 and the second mounting layers 221. The diodes 32 are in one-to-one correspondence with the switching elements 31. Each diode 32 is electrically connected to a corresponding one of the switching elements 31. In the semiconductor device A10, the diodes 32 are Schottky barrier diodes.

As shown in FIGS. 11 and 17 to 20, each diode 32 includes an anode 321 and a cathode 322. Each anode 321 is disposed on the upper face of the diode 32, the upper face facing in the direction in which the first obverse surface 111 of the first substrate 11 (or the second obverse surface 121 of the second substrate 12) faces in the thickness direction z. Each cathode 322 is disposed on the lower face of the diode 32, the lower face facing opposite to the direction in which the first obverse surface 111 of the first substrate 11 (or the second obverse surface 121 of the second substrate 12) faces in the thickness direction z. Each cathode 322 is electrically connected to one of the first mounting layers 211 and the second mounting layers 221 via a electroconductive bonding layer 39. Thus, the cathode 322 of each diode 32 is electrically connected to one of the first mounting layers 211 and the second mounting layers 221.

As shown in FIGS. 3 and 8, the semiconductor device A10 includes the thermistor 33. The thermistor 33 is electrically connected to the pair of thermistor mounting layers 215. In the semiconductor device A10, the thermistor 33 is a NTC (negative temperature coefficient thermistor). NTC thermistors have such a characteristic that the resistance gently decreases with increasing temperature. The thermistor 33 is used as a temperature sensor of the semiconductor device A10. The thermistor 33 is electrically connected to the pair of thermistor terminals 29 via the pair of thermistor mounting layers 215 and the pair of thermistor wires 45.

As shown in FIGS. 17 to 20, the semiconductor device A10 includes first wires 411 to sixth wires 416, first gate wires 421 and first detection wires 431. These wires are electroconductive components each connected at one end to either a switching element 31 or a diode 32 or connected to a switching elements 31 and a diode 32. The electroconductive components may be made of aluminum.

Figure 17:
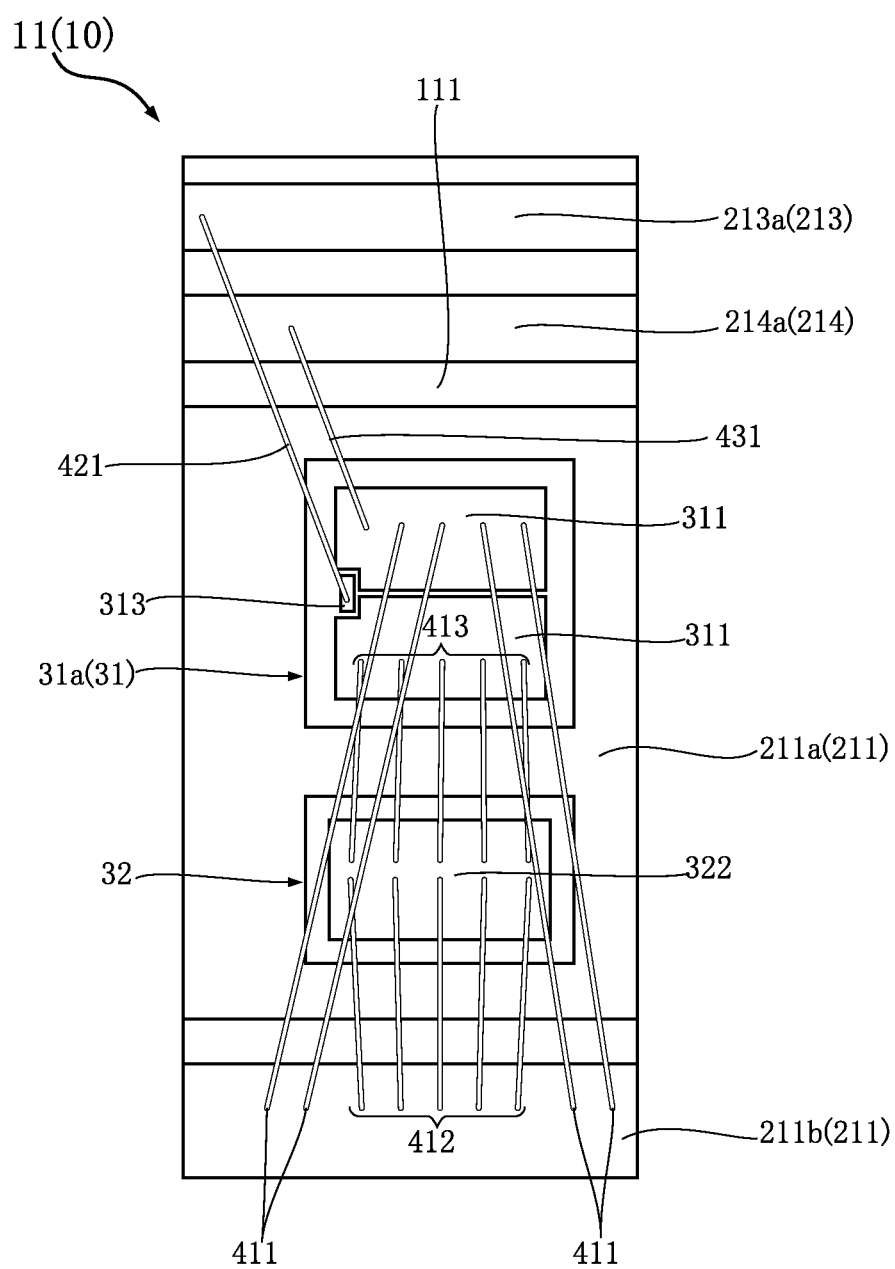
FIG. 17 is an enlarged plan view showing a switching element and a diode that are mounted on a first upper arm mounting layer out of first mounting layers.

With reference to FIG. 17, the following describes a plurality of first wires 411, a plurality of second wires 412 and a plurality of third wires 413 that are separately connected to a first element 31a mounted on the first upper arm mounting layer 211a and a corresponding diode 32. The plurality of first wires 411 are separately connected to the first electrode 311 of the first element 31a and to the first lower arm mounting layer 211b. The plurality of second wires 412 are separately connected to the anode 321 of the diode 32 and to the first lower arm mounting layer 211b. In this way, the respective first electrodes 311 of the first elements 31a that are mounted on the first upper arm mounting layer 211a, as well as the respective anodes 321 of the corresponding diode 32, are electrically connected to the first lower arm mounting layer 211b. The plurality of third wires 413 are connected to the first electrode 311 of the first element 31a and to the anode 321 of the corresponding diode 32. In this way, the respective anodes 321 of the diodes 32 that are mounted on the first upper arm mounting layer 211a are electrically connected to the respective first electrodes 311 of the corresponding first elements 31a.

The following describes the first gate wires 421 and the first detection wires 431 each separately connected to a first element 31a mounted on the first upper arm mounting layer 211a, with reference to FIG. 17. The first gate wire 421 is connected to the gate electrode 313 of the first element 31a and to the first upper arm gate layer 213a. The first detection wire 431 is connected to the first electrode 311 of the first element 31a and to the first upper arm detection layer 214a.

Figure 18:
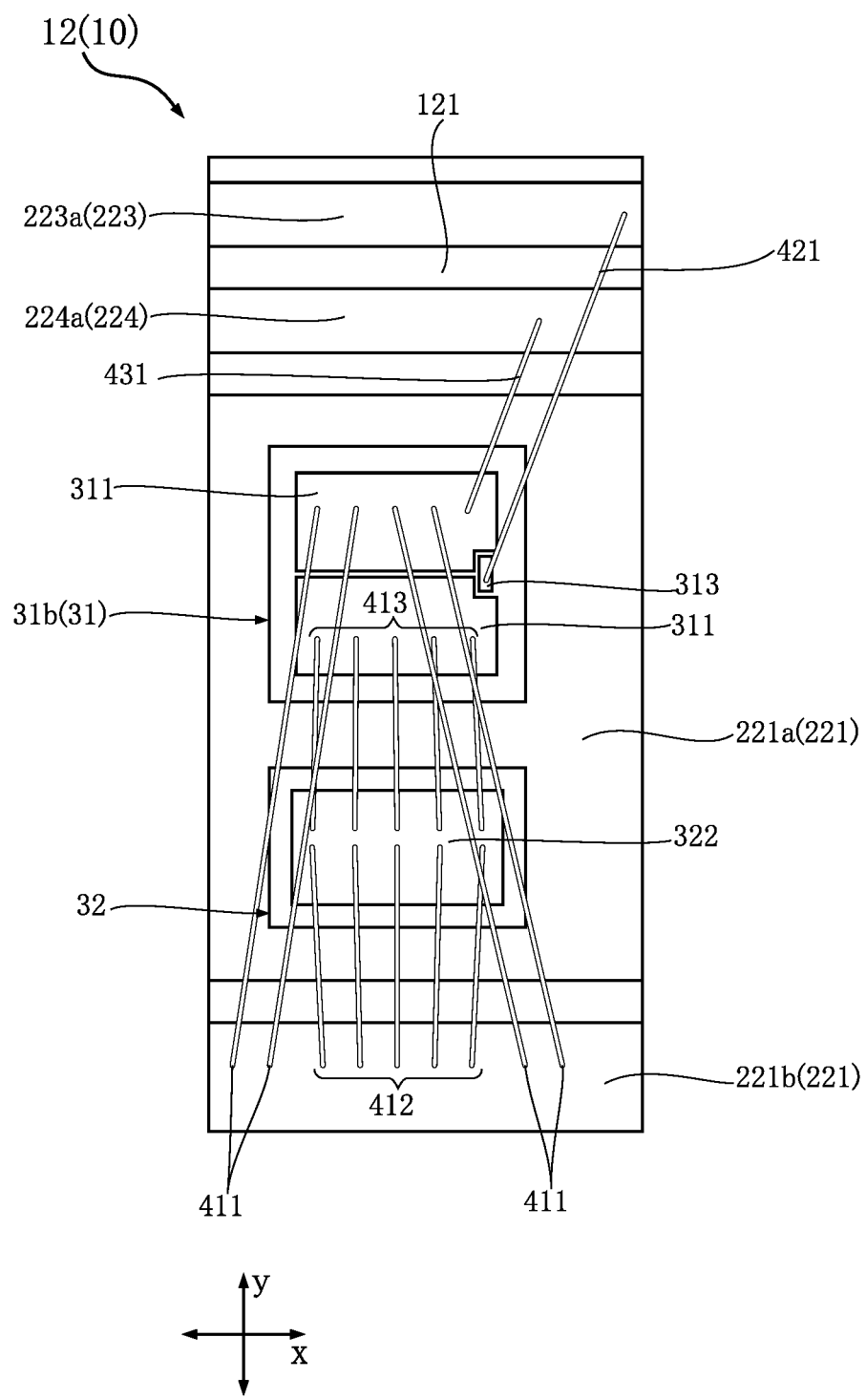
FIG. 18 is an enlarged plan view showing a switching element and a diode that are mounted on a second upper arm mounting layer out of second mounting layers.

With reference to FIG. 18, the following describes a plurality of first wires 411, a plurality of second wires 412 and a plurality of third wires 413 that are separately connected to a second element 31b mounted on the second upper arm mounting layer 221a and a corresponding diode 32. The plurality of first wires 411 are separately connected to the first electrode 311 of the second element 31b and to the second lower arm mounting layer 221b. The plurality of second wires 412 are separately connected to the anode 321 of the diode 32 and to the second lower arm mounting layer 221b. In this way, the respective first electrodes 311 of the second elements 31 that are mounted on the second upper arm mounting layer 221a, as well as the respective anodes 321 of the corresponding diodes 32, are electrically connected to the second lower arm mounting layer 221b. The plurality of third wires 413 are connected to the first electrode 311 of the second element 31b and to the anode 321 of the corresponding diode 32. In this way, the respective anodes 321 of the diodes 32 that are mounted on the second upper arm mounting layer 221a are electrically connected to the respective first electrodes 311 of the corresponding first elements 31a.

With reference to FIG. 18, the following describes a plurality of first gate wires 421 and a plurality of first detection wires 431 that are separately connected to a second element 31b mounted on the second upper arm mounting layer 221a. The plurality of first gate wire 421 are separately connected to the gate electrode 313 of the second element 31b and to the second upper arm gate layer 223a. The plurality of first detection wires 431 are separately connected to the first electrode 311 of the second element 31b and to the second upper arm detection layer 224a.

Figure 19:
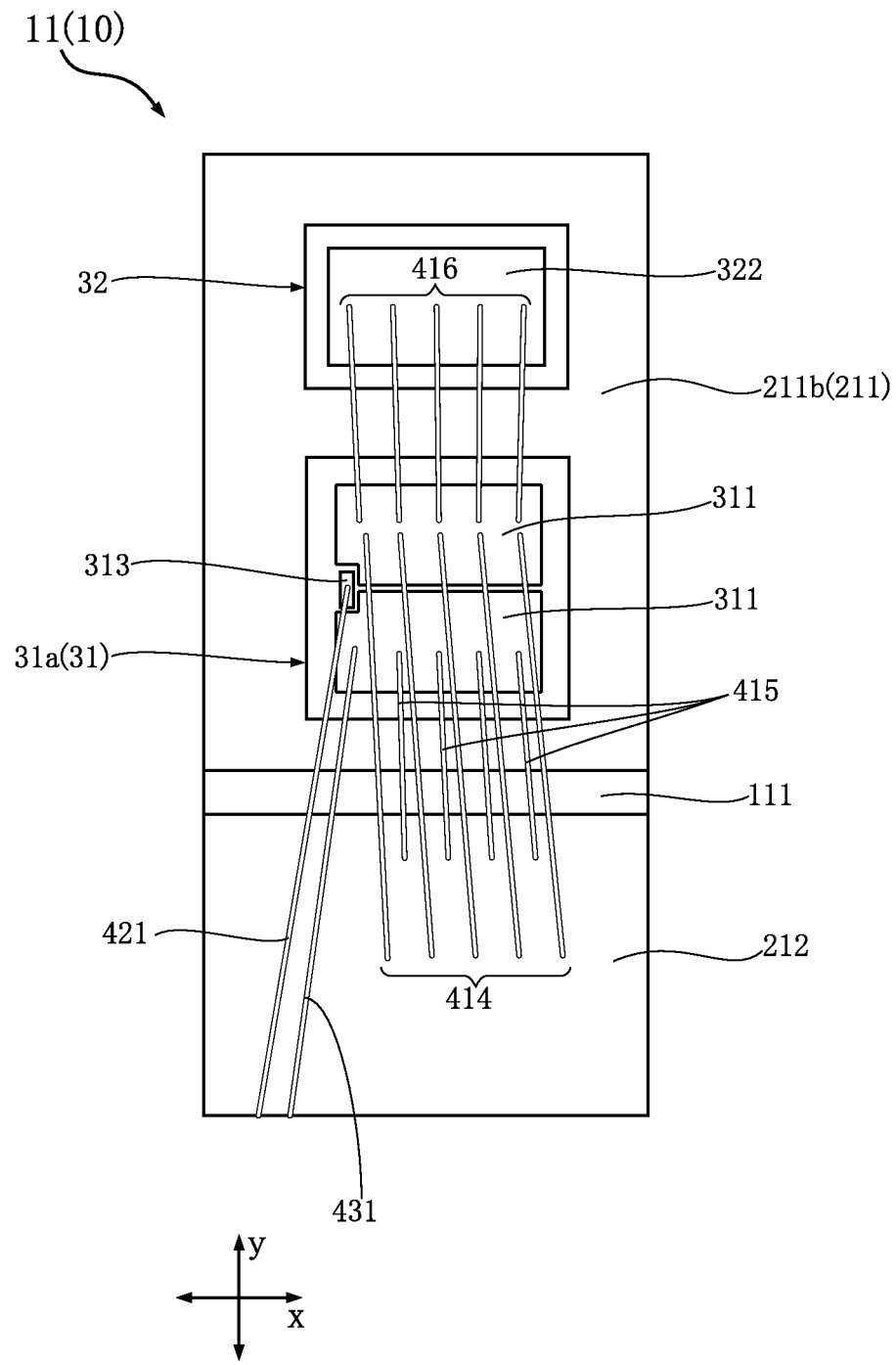
FIG. 19 is an enlarged plan view showing a switching element and a diode that are mounted on a first lower arm mounting layer out of the first mounting layers.

With reference to FIG. 19, the following describes a plurality of fourth wires 414, a plurality of fifth wires 415 and a plurality of sixth wires 416 that are separately connected to a first element 31a mounted on the first lower arm mounting layer 211b and a corresponding diode 32. The plurality of fourth wires 414 are separately connected to one of the regions of the first electrode 311 of the first element 31a and to the first electroconductive layer 212. The plurality of fifth wires 415 are separately connected to the other region of the first electrode 311 of the first element 31a and to the first electroconductive layer 212. In this way, the respective first electrodes 311 of the first elements 31a that are mounted on the first lower arm mounting layer 211b are electrically connected to the first electroconductive layer 212. The plurality of sixth wires 416 are separately connected to the other region of the first electrode 311 of the first element 31a and to the anode 321 of the corresponding diode 32. In this way, the respective anodes 321 of the diodes 32 that are mounted on the first lower arm mounting layer 211b are electrically connected to the respective first electrodes 311 of the corresponding second elements 31b and also to the first electroconductive layer 212 via the fifth wires 415.

FIG. 17 illustrates that the first upper arm mounting layer 211a is electrically connected to the first lower arm mounting layer 211b via the first elements 31a and the first wires 411. FIG. 19 illustrates that the first lower arm mounting layer 211b is electrically connected to the first electroconductive layer 212 via the first elements 31a and the fifth wires 415. Since the first upper arm mounting layer 211a and the first electroconductive layer 212 are electrically connected to each other, the power supply terminals 23 are electrically connected to the first mounting layers 211.

The following describes the first gate wires 421 and the first detection wires 431 each separately connected to a first element 31a mounted on the first lower arm mounting layer 211b, with reference to FIGS. 8 and 19. The first gate wire 421 is connected to the gate electrode 313 of the first element 31a and to the first lower arm gate layer 213b. The first detection wire 431 is connected to the first electrode 311 of the first element 31a and to the first lower arm detection layer 214b.

Figure 20:
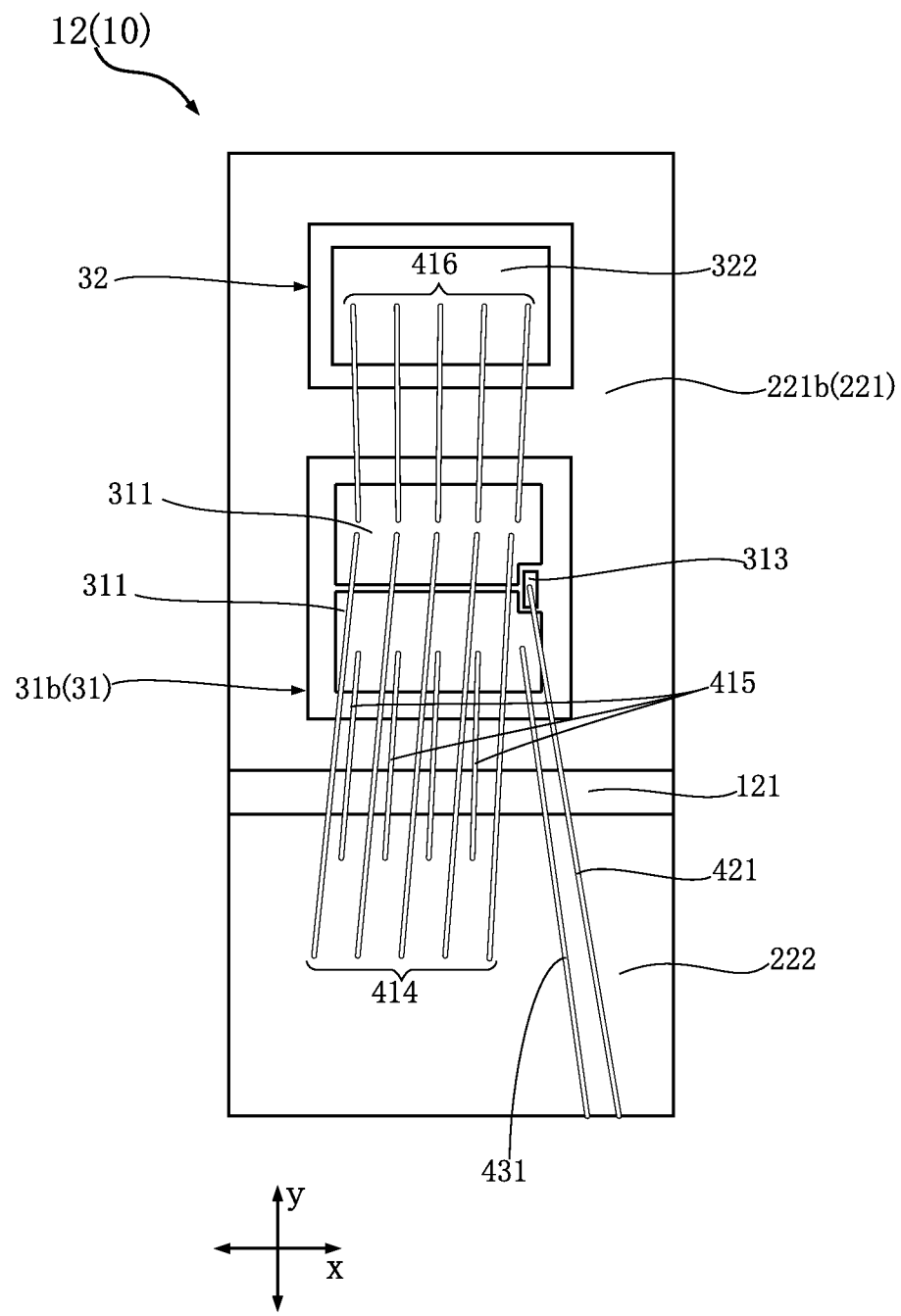
FIG. 20 is an enlarged plan view showing a switching element and a diode that are mounted on a second lower arm mounting layer out of the second mounting layers.

With reference to FIG. 20, the following describes a plurality of fourth wires 414, a plurality of fifth wires 415 and a plurality of sixth wires 416 that are separately connected to a second element 31b mounted on the second lower arm mounting layer 221b and a corresponding diode 32. The plurality of fourth wires 414 are separately connected to one of the regions of the first electrode 311 of the second element 31b and to the second electroconductive layer 222. The plurality of fifth wires 415 are separately connected to the other region of the first electrode 311 of the second element 31b and to the second electroconductive layer 222. In this way, the respective first electrodes 311 of the second elements 31b that are mounted on the second lower arm mounting layer 221b are electrically connected to the second electroconductive layer 222. The plurality of sixth wires 416 are separately connected to the other region of the first electrode 311 of the second element 31b and to the anode 321 of the corresponding diode 32. In this way, the respective anodes 321 of the diodes 32 that are mounted on the second lower arm mounting layer 221b are electrically connected to the respective first electrodes 311 of the corresponding second elements 31b and also to the second electroconductive layer 222 via the fifth wires 415.

FIG. 18 illustrates that the second upper arm mounting layer 221a is electrically connected to the second lower arm mounting layer 221b via the second elements 31b and the first wires 411. FIG. 20 illustrates that the second lower arm mounting layer 221b is electrically connected to the second electroconductive layer 222 via the second elements 31b and the fifth wires 415. Thus, the second upper arm mounting layer 221a and the second electroconductive layer 222 are electrically connected to each other.

The following describes the first gate wires 421 and the first detection wires 431 each separately connected to a second element 31b mounted on the second lower arm mounting layer 221b, with reference to FIGS. 9 and 20. The first gate wire 421 is connected to the gate electrode 313 of the second element 31b and to the second lower arm gate layer 223b. The first detection wire 431 is connected to the first electrode 311 of the second element 31b and to the second lower arm detection layer 224b.

As shown in FIG. 10, the semiconductor device A10 includes second gate wires 422. The second gate wires 422 are electroconductive components each connected to one of the gate terminals 27 and to one of the first gate layers 213 and the second gate layers 223. The semiconductor device A10 includes two second gate wires 422. The second gate wires 422 may be made of aluminum.

As shown in FIG. 10, one of the second gate wires 422 is connected to the first gate terminal 27a and to the first upper arm gate layer 213a. Thus, the first gate terminal 27a is electrically connected to the gate electrodes 313 of the first elements 31a that are mounted on the first upper arm mounting layer 211a and also to the gate electrodes 313 of the second elements 31b that are mounted on the second upper arm mounting layer 221a. This second gate wire 422 is connected to the first upper arm gate layer 213a at a point between the connection point of the first gate wire 421 nearest to the second substrate 12, which is located opposite in the first direction x, and the connection point of the first gate wire 421 located next to the nearest first gate wire.

As shown in FIG. 10, the other second gate wire 422 is connected to the second gate terminal 27b and to the second lower arm gate layer 223b. Thus, the second gate terminal 27b is electrically connected to the gate electrodes 313 of the first elements 31a that are mounted on the first lower arm mounting layer 211b and also to the gate electrodes 313 of the second elements 31b that are mounted on the second lower arm mounting layer 221b. This second gate wire 422 is connected to the second lower arm gate layer 223b at a point between the connection point of the first gate wire 421 nearest to the first substrate 11, which is located opposite in the first direction x, and the connection point of the first gate wire 421 located next to the nearest first gate wire.

As shown in FIG. 10, the semiconductor device A10 includes second detection wires 423. The second detection wires 432 are electroconductive components each connected to one of the element current detection terminals 281 and to one of the first detection layers 214 and the second detection layers 224. The semiconductor device A10 includes two second detection wires 432. The second detection wires 432 may be made of aluminum.

As shown in FIG. 10, one of the second detection wires 432 is connected to the first detection terminal 281a and to the second upper arm detection layer 224a. Thus, the first detection terminal 281a is electrically connected to the first electrodes 311 of the first elements 31a that are mounted on the first upper arm mounting layer 211a and also to the first electrodes 311 of the second elements 31b that are mounted on the second upper arm mounting layer 221a. This second detection wire 432 is connected to the second upper arm detection layer 224a at a point between the connection point of the first detection wire 431 nearest to the first substrate 11, which is located opposite in the first direction x, and the connection point of the first detection wire 431 located next to the nearest first detection wire.

As shown in FIG. 10, the other second detection wire 432 is connected to the second detection terminal 281b and to the first lower arm detection layer 214b. Thus, the second detection terminal 281b is electrically connected to the first electrodes 311 of the first elements 31a that are mounted on the first lower arm mounting layer 211b and also to the first electrodes 311 of the second elements 31b that are mounted on the second lower arm mounting layer 221b. This second detection wire 432 is connected to the first lower arm detection layer 214b at a point between the connection point of the first detection wire 431 nearest to the second substrate 12, which is located opposite in the first direction x, and the connection point of the first detection wire 431 located next to the nearest first detection wire.

Figure 7:
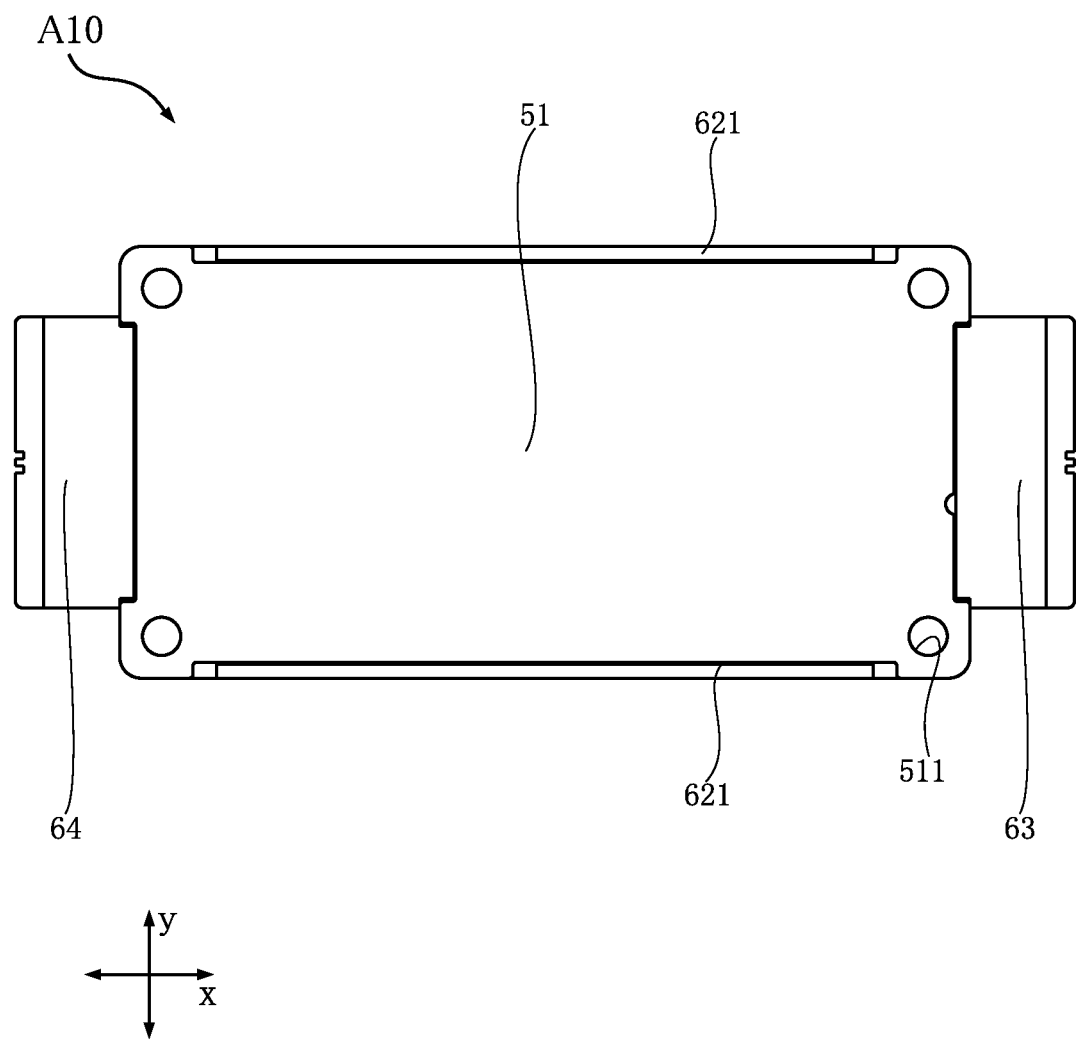
FIG. 7 is a bottom view of the semiconductor device shown in FIG. 1.

As shown in FIG. 11, the heatsink 51 is bonded to both the first reverse surface 112 of the first substrate 11 and the second reverse surface 122 of the second substrate 12. The heatsink 51 thus supports the first substrate 11 and the second substrate 12. The heatsink 51 is composed of a flat metal plate, and the metal may be copper. The heatsink 51 may be plated with nickel. The heatsink 51 has a part exposed from the semiconductor device A10, and a different cooling component may be attached to the exposed part of the heatsink 51. As shown in FIGS. 7 to 9, the heatsink 51 has support holes 511 at its four corners as viewed in the thickness direction z. The support holes 511 penetrates the heatsink 51 in the thickness direction z. The support holes 511 are used to secure the heats ink 51, which supports the first substrate 11 and the second substrate 12, to the case 60.

As shown in FIG. 11, a heat transfer layer 52 is disposed on the first reverse surface 112 of the first substrate 11 and the second reverse surface 122 of the second substrate 12. The heat transfer layer 52 may be made of a metallic material such as a copper foil. The heat transfer layer 52 transfers heat generated by the switching elements 31 during operation to the heatsink 51.

As shown in FIG. 11, an adhesive layer 59 is disposed between the heatsink 51 and the heat transfer layer 52. The adhesive layer 59 is used to bond the heatsink 51 to the first substrate 11 and the second substrate 12. The adhesive layer 59 may be made of a material such as a lead-free solder mainly composed of tin. That is, the heatsink 51 is bonded to the first substrate 11 and the second substrate 12 via the heat transfer layer 52 and the adhesive layer 59.

As shown in FIGS. 2 to 6, the case 60 is an electrically insulating member that surrounds the first substrate 11 and the second substrate 12 as viewed in the thickness direction z. The case 60 may be made of a synthetic resin with excellent heat resistance, such as PPS (polyphenylene sulfide). The case 60 has a pair of first side walls 611, a pair of second side walls 612, mounting parts 62, a power supply terminal base 63 and an output terminal base 64.

As shown in FIGS. 2 and 3, the first side walls 611 are spaced apart from each other in the first direction x. The first side walls 611 are oriented along both the second direction y and the thickness direction z, and one end of each first side wall in the thickness direction z is in contact with the heatsink 51.

As shown in FIGS. 2 and 3, the second side walls 612 are spaced apart from each other in the second direction y. The second side walls 612 are oriented along both the first direction x and the thickness direction z, and one end of each second side wall in the thickness direction z is in contact with the heatsink 51. The opposite ends of each second side wall 612 in the first direction x are contiguous with the pair of first side walls 611. The first gate terminal 27a, the first detection terminal 281a, the source current detection terminal 282 and the pair of thermistor terminals 29 are embedded in one of the second side walls 612. The second gate terminal 27b and the second detection terminal 281b are embedded in the other second side wall 612. As shown in FIGS. 8 to 10, these terminals are supported by the second side walls 612 at their ends closer to the first substrate 11 and the second substrate 12 in the thickness direction z.

As shown in FIGS. 2, 8 and 9, the mounting parts 62 are provided at the four corners of the case 60 as viewed in the thickness direction z. The lower surfaces of the mounting parts 62 are in contact with the heatsink 51. Each mounting part 62 has amounting hole 621 extending therethrough in the thickness direction z. The positions of the mounting holes 621 coincide with the positions of the support holes 511 in the heatsink 51. By inserting fastening members, such as pins, into the mounting holes 621 and the support holes 511, the heatsink 51 is securely supported by the case 60.

Figure 5:
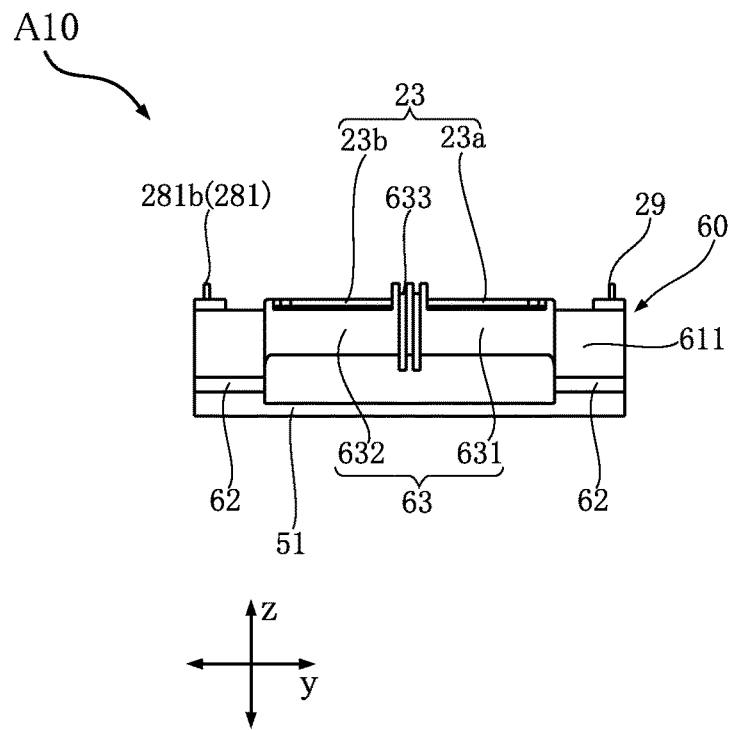
FIG. 5 is a right side view of the semiconductor device shown in FIG. 1.

As shown in FIGS. 2, 5 and 8, the power supply terminal base 63 extends outward in the first direction x from one of the first side walls 611. The power supply terminal base 63 supports the power supply terminals 23. The power supply terminal base 63 includes a first terminal base 631 and a second terminal base 632. The first terminal base 631 and the second terminal base 632 are spaced apart from each other in the second direction y. The first terminal base 631 supports the first power supply terminal 23a. The external connection part 231 of the first power supply terminal 23a is exposed from the first terminal base 631. The second terminal base 632 is used to support the second power supply terminal 23b. The external connection part 231 of the second power supply terminal 23b is exposed from the second terminal base 632. A plurality of grooves 633 are formed to extend in the first direction x between the first terminal base 631 and the second terminal base 632. As shown in FIGS. 8 and 12, a pair of nuts 634 are provided, one in the first terminal base 631 and the other in the second terminal base 632. The pair of nuts 624 correspond to the pair of connecting holes 231a in the first power supply terminal 23a and the second power supply terminal 23b. The fastening members such as bolts inserted in the connecting holes 231a will come into engagement with the nuts 634.

Figure 6:
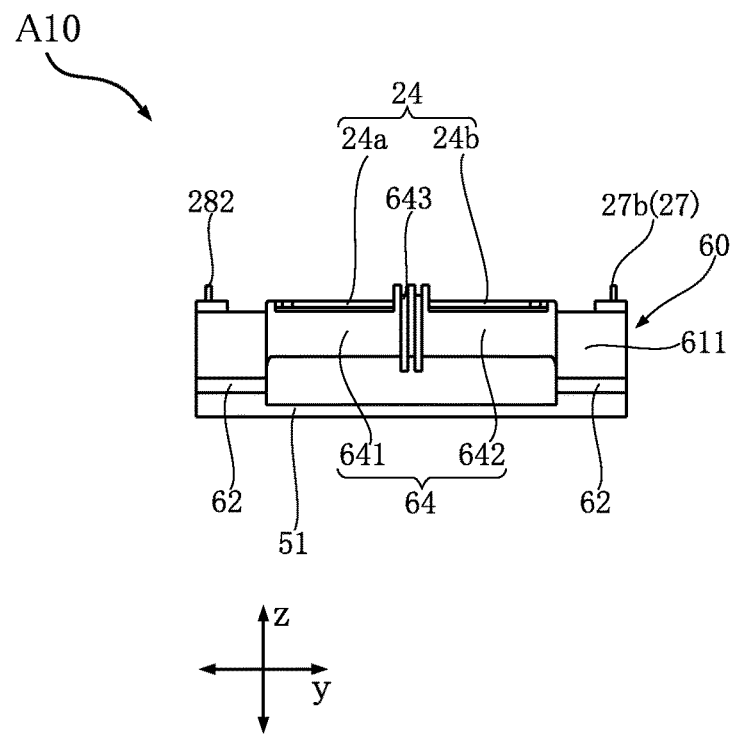
FIG. 6 is a left side view of the semiconductor device shown in FIG. 1.

As shown in FIGS. 2, 6 and 9, the output terminal base 64 extends outward in the first direction x from the other first side wall 611. The output terminal base 64 supports the output terminal 24. The output terminal base 64 includes a first terminal base 641 and a second terminal base 642. The first terminal base 641 and the second terminal base 642 are spaced apart from each other in the second direction y. The first terminal base 641 supports the first terminal part 24a of the output terminal 24. The external connection part 241 of the first terminal part 24a is exposed from the first terminal base 641. The second terminal base 642 supports the second terminal part 24b of the output terminal 24. The external connection part 241 of the second terminal part 24b is exposed from the second terminal base 642. A plurality of grooves 643 are formed to extend in the first direction x between the first terminal base 641 and the second terminal base 642. As shown in FIGS. 9 and 13, a pair of nuts 644 are provided, one in the first terminal base 641 and the other the second terminal base 642. The pair of nuts 644 correspond to the pair of connection holes 241a in the first terminal part 24a and the second terminal part 24b. The fastening members such as bolts inserted in the connecting holes 241a will come into engagement with the nuts 644.

As shown in FIG. 2, the top plate 69 closes the interior of the semiconductor device A10 defined by the heatsink 51 and the case 60. The top plate 69 faces toward the obverse surface 111 of the first substrate 11 and the second obverse surface 121 of the second substrate 12. The top plate 69 is spaced apart from the obverse surface 111 and the second obverse surface 121 in the thickness direction z and supported on the pair of first side walls 611 and the pair of second side walls 612 of the case 60. The top plate 69 is made of an electrically insulating synthetic resin. Note that the top plate 69 may be omitted, in which case the interior may be filled with silicone gel.

Figure 21:
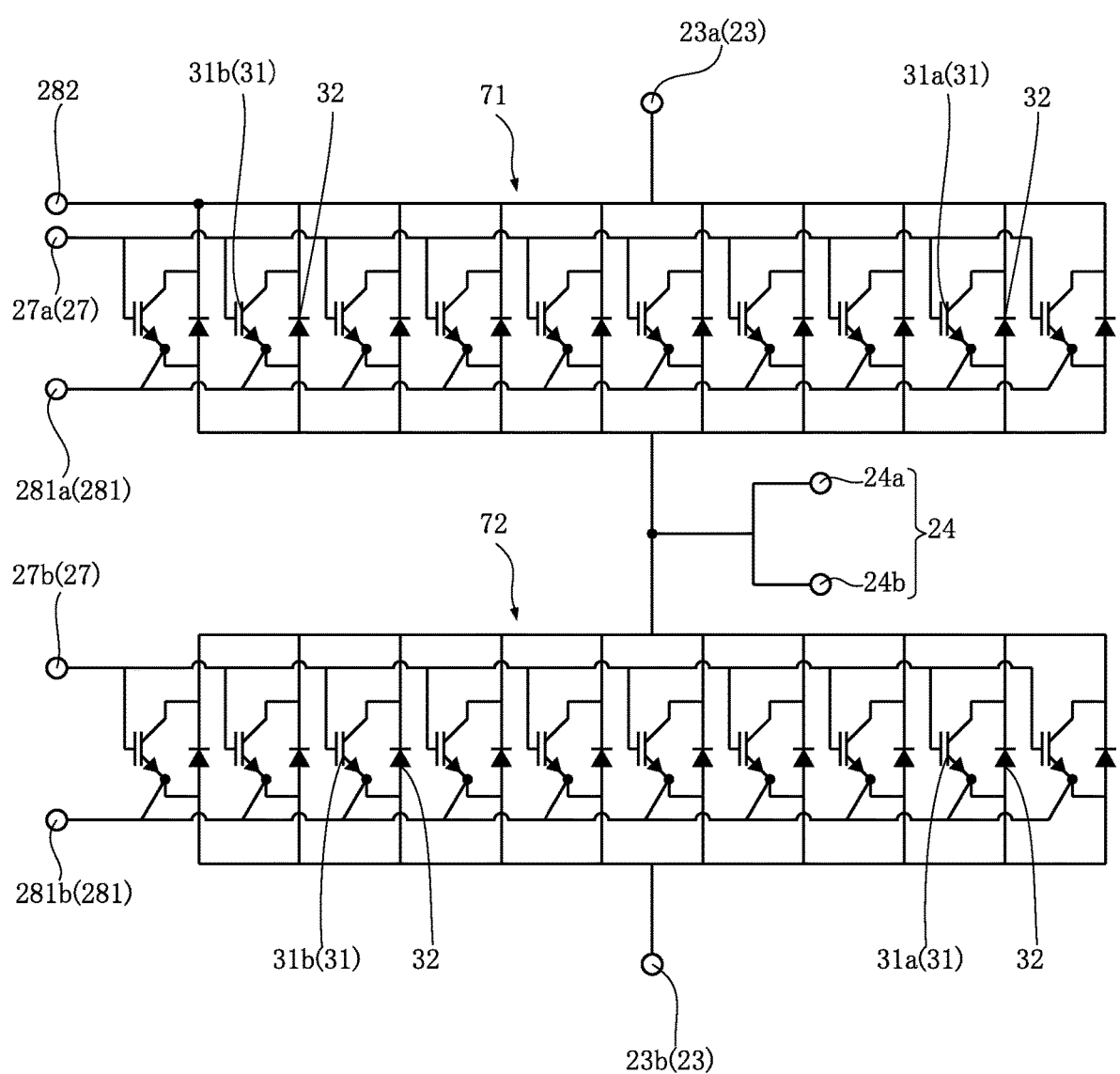
FIG. 21 is a circuit diagram of the semiconductor device shown in FIG. 1.

With reference to FIG. 21, the following describes the circuit configuration of the semiconductor device A10.

As shown in FIG. 21, the semiconductor device A10 includes two switching circuits, namely an upper arm circuit 71 and a lower arm circuit 72. The upper arm circuit 71 is composed of the first upper arm mounting layer 211a and the second upper arm mounting layer 221a, along with the switching elements 31 and the diodes 32 that are mounted on these two layers. The switching elements 31 and the diodes 32 mounted on the first upper arm mounting layer 211a and the first lower arm mounting layer 211b are connected in parallel between the first power supply terminal 23a and the output terminal 24. The gate electrodes 313 of the switching elements 31 in the upper arm circuit 71 are connected in parallel to the first gate terminal 27a. By applying a gate voltage to the first gate terminal 27a from a driving circuit such as a gate driver external to the semiconductor device A10, the switching elements 31 in the upper arm circuit 71 are driven simultaneously.

The first electrodes 311 of the switching elements 31 in the upper arm circuit 71 are connected in parallel to the first detection terminal 281a. The emitter current flowing through the switching elements 31 in the upper arm circuit 71 is input via the first detection terminal 281a to a control circuit that is external to the semiconductor device A10.

In the upper arm circuit 71, when a voltage is applied from the first power supply terminal 23a and the second power supply terminal 23b to the first upper arm mounting layer 211a and the first lower arm mounting layer 211b, the applied voltage is input via the source current detection terminal 282 to a control circuit that is external to the semiconductor device A10.

The lower arm circuit 72 is composed of the first lower arm mounting layer 211b and the second lower arm mounting layer 221b, along with the switching elements 31 and the diodes 32 that are mounted on these two layers. The switching elements 31 and the diodes 32 mounted on the first lower arm mounting layer 211b and the second lower arm mounting layer 221b are connected in parallel between the output terminal 24 and the second power supply terminal 23b. The gate electrodes 313 of the switching elements 31 in the lower arm circuit 72 are connected in parallel to the second gate terminal 27b. By applying a gate voltage to the second gate terminal 27b from a driving circuit such as a gate driver external to the semiconductor device A10, the switching elements 31 in the lower arm circuit 72 are driven simultaneously.

The first electrodes 311 of the switching elements 31 in the lower arm circuit 72 are connected in parallel to the second detection terminal 281b. The emitter current flowing through the switching elements 31 in the upper arm circuit 71 is input via the second detection terminal 281b to a control circuit that is external to the semiconductor device A10.

By connecting a DC power supply to the first power supply terminal 23a and the second power supply terminal 23b to drive the switching elements 31 in the upper arm circuit 71 and the lower arm circuit 72, AC voltage of various frequencies are output from the output terminal 24. The AC voltage thus output from the output terminal 24 is supplied to a power supply target such as a motor.

The following describes advantages of the semiconductor device A10.

<Advantages of Electroconductive Coupling Members 25>

The semiconductor device A10 includes the electroconductive coupling members 25 each separately connected to a first mounting layer 211 and to a second mounting layer 221. Each electroconductive coupling member 25 has strip sections 251 and a connecting section 252. The strip sections 251 extend in the first direction x and are spaced apart from each other in the second direction y. The connecting section 252 extends in the second direction y to interconnect the strip sections 251. The strip sections 251 are connected at one end to the first mounting layer 211, and the strip sections 251 are connected at the other ends to the second mounting layer 221. The strip sections 251 have a larger sectional area perpendicular to the first direction x than the cross-sectional area of wires. This allows the electroconductive coupling members 25 to conduct a larger electric current, and consequently allows the semiconductor device A10 to carry large electric current. In addition, the electroconductive coupling members 25 of this configuration can reduce the area of the connection regions, which are connected to the first mounting layer 211 and the second electroconductive layer 222, as compared with electroconductive coupling members 25 made of rectangular metal plate. Thus, the regions in the substrates 10 subjected to intensive thermal stress are also reduced. In this way, the semiconductor device A10 is enabled to carry large electric current and also to reduce the thermal stress concentration occurring in the substrates 10.

Figure 22:
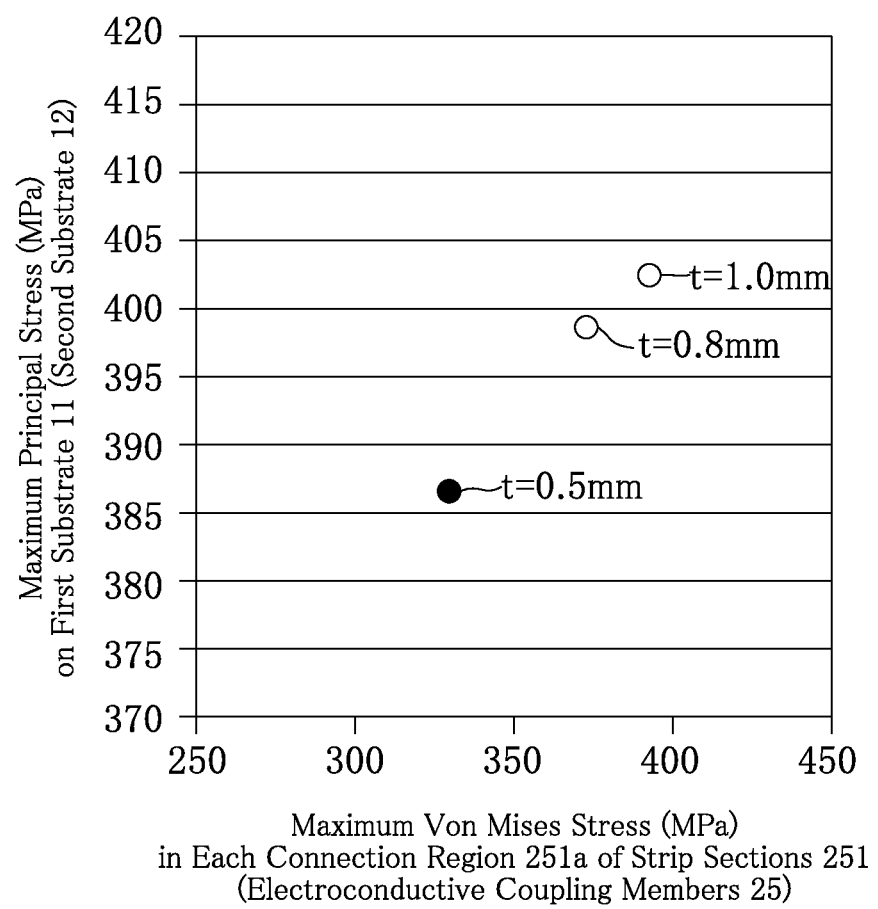
FIG. 22 shows the analytical results of thermal stress on the components of the semiconductor device shown in FIG. 1.

The electroconductive coupling members 25 are made of flat metal plates having a thickness smaller than the thickness of the power supply terminals 23 and the output terminal 24. This configuration facilitates further reduction of the thermal stress concentration occurring in the substrates 10. Referring to FIG. 22, as the thickness of the electroconductive coupling members 25 is reduced from 1.0 mm, which is equal to the thickness of the power supply terminals 23 and the output terminal 24, the maximum Von Mises stress in each connection region 251a of each strip section 251 decreases. This is presumably because the thermal strain on the strip sections 251 gradually decreases with the gradual reduction in thickness of the electroconductive coupling members 25. The decrease in the maximum Von Mises stress in the connection regions 251a results in decrease in the maximum principal stress on the first substrate 11 and the second substrate 12. This means that the concentration of thermal stress in the first substrate 11 and the second substrate 12 is reduced. To effectively avoid damaging the first substrate 11 and the second substrate 12 by thermal stress concentration, the electroconductive coupling members 25 having a thickness of 0.3 to 0.5 mm are preferred.

The strip sections 251 are connected to the first mounting layers 211 and to the second mounting layers 221 both by ultrasonic bonding. As shown in FIG. 16, the ultrasonic boning involves moving the capillary 80 sidewise in an extremely small amount, as compared with wire bonding. Thus, it is not necessary to provide clearance for the sidewise movement of the capillary 80 neither on the first obverse surface 111 of the first substrate 11 nor on the second obverse surface 121 of the second substrate 12. Consequently, a greater number of switching elements 31 can be mounted on the first mounting layers 211 and the second mounting layers 221, so that the output of the semiconductor device A10 can be increased.

<Advantages of Second Gate Wires 422 and Second Detection Wires 432>

In the semiconductor device A10, the gate terminals 27 and the element current detection terminals 281 are adjacent to one another. Specifically, the first gate terminal 27a is adjacent to the first detection terminal 281a, and the second gate terminal 27b is adjacent to the second detection terminal 281b. The first gate terminal 27a and the first detection terminal 281a face the second substrate 12 in the second direction y. The second gate terminal 27b and the second detection terminal 281b face the first substrate 11 in the second direction y.

The first gate terminal 27a and the first detection terminal 281a are connected as shown in FIG. 10. That is, the second gate wire 422 connected to the first gate terminal 27a is connected to the first upper arm gate layer 213a (one of the first gate layers 213) disposed on the first substrate 11. The second detection wire 432 connected to the first detection terminal 281a is connected to the second upper arm detection layer 224a (one of the second detection layers 224) disposed on the second substrate 12.

The second gate terminal 27b and the second detection terminal 281b are connected as shown in FIG. 10. That is, the second gate wire 422 connected to the second gate terminal 27b is connected to the second lower arm gate layer 223b (one of the second gate layers 223) disposed on the second substrate 12. The second detection wire 432 connected to the second detection terminal 281b is disposed on the first lower arm detection layer 214b (one of the first detection layers 214) disposed on the first substrate 11.

With this connection layout of the second gate wires 422 and the second detection wires 432, the variation in parasitic gate inductance among the switching elements 31 can be reduced, and thus switching errors of the switching element 31 can be avoided.

Figure 23:
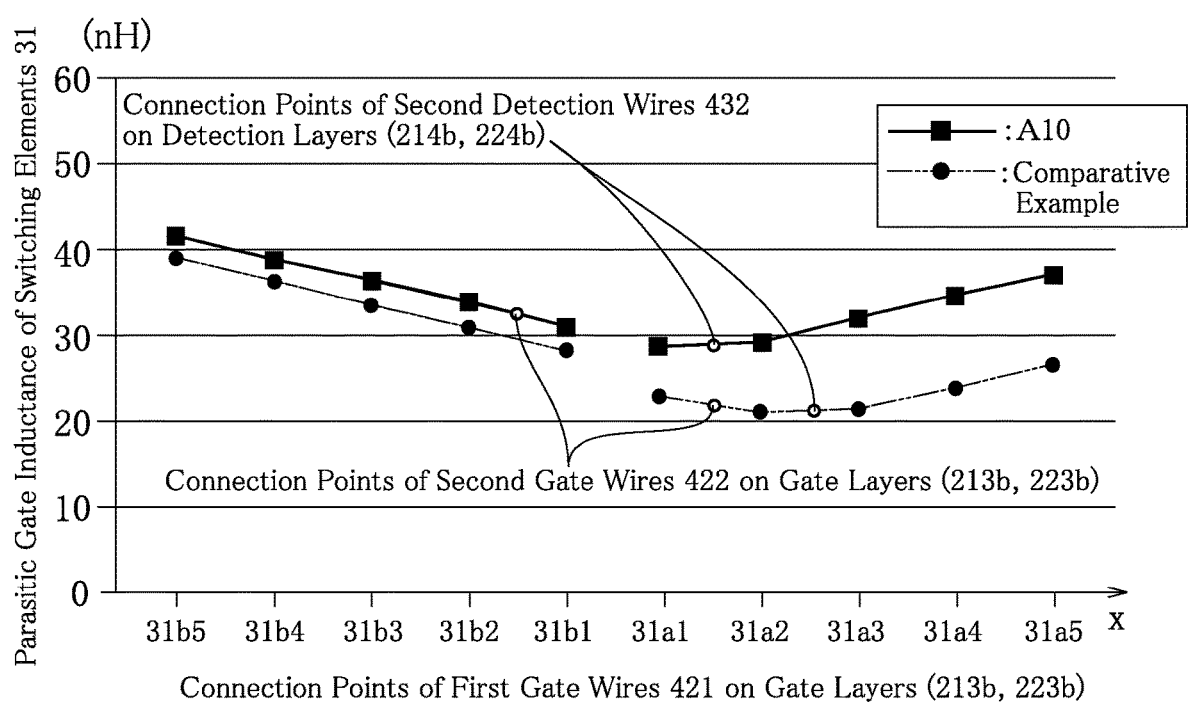
FIG. 23 shows the values of parasitic gate inductance measured on the switching elements of the semiconductor device shown in FIG. 1 and on a semiconductor device of a comparative example.

With reference to FIG. 23, the following describes the advantages achieved in the semiconductor device A10 by reducing variation in parasitic gate inductance among the switching elements 31. In FIG. 23, the horizontal axis represents the positions, on the first lower arm gate layer 213b and the second lower arm gate layer 223b, of the connection points of the first gate wires 421 of the switching elements 31 constituting the lower arm circuit 72. The direction of the horizontal axis corresponds to the first direction x. Thus, the right side of FIG. 23 corresponds to the positions of the power supply terminals 23, and the left side to the position of the output terminal 24. In FIG. 23, elements 31a1, 31a2, . . . , and 31a5 represent the first elements 31a mounted on the first lower arm mounting layer 211b (one of the first mounting layers 211). For example, the element 31a5 represents the first element 31a nearest to the power supply terminals 23, among the first elements 31a mounted on the first lower arm mounting layer 211b. In FIG. 23, the elements 31b1, 31b2, . . . , and 31b5 represent the second elements 31b mounted on the second lower arm mounting layer 221b (one of the second mounting layers 221). For example, the element 31b5 represents the second element 31b nearest to the output terminal 24, among the second elements 31b mounted on the second lower arm mounting layer 221b.

The vertical axis in FIG. 23 represents the values of parasitic gate inductance (unit: nH) measured on the switching elements 31 constituting the lower arm circuit 72. FIG. 23 shows the parasitic gate inductance values of measured on the semiconductor device A10 of the present disclosure and those on a conventional semiconductor device as a comparative example. For the comparative example, the second gate wire 422 that is connected to the second gate terminal 27b is connected to the first lower arm gate layer 213b in a region located between the connection point of the first gate wire 421 corresponding to the element 31a1 and the connection point of the first gate wire 421 corresponding to the element 31a2. For the comparative example, in addition, the second detection wire 432 that is connected to the second detection terminal 281b is connected to the first lower arm detection layer 214b in a region located between the connection point of the first detection wire 431 corresponding to the element 31a2 and the connection point of the first detection wire 431 corresponding to the element 31a3.

In the semiconductor device A10, the second gate wire 422 that is connected to the second gate terminal 27b is connected to the second lower arm gate layer 223b in a region located between the connection point of the first gate wire 421 corresponding to the element 31b1 and the connection point of the first gate wire 421 corresponding to the element 31b2. That is, in the semiconductor device A10, the second gate wire 422 connected to the second gate terminal 27b is longer than the corresponding second wire 422 of the comparative example. The conduction paths in the semiconductor device A10 from the second gate terminal 27b to the elements 31b1, 31b2, . . . , and 31b5 are substantially equal in length to the corresponding conduction paths in the comparative example. Therefore, as FIG. 23 shows for the semiconductor device A10, the second elements 31b mounted on the second lower arm mounting layer 221b exhibit the parasitic gate inductance that is substantially equal to the parasitic gate inductance of the corresponding second elements 31b in the comparative example.

Further, the conduction paths in the semiconductor device A10 from the second gate terminal 27b to the respective gates of the elements 31a1, 31a2, . . . , and 31a5 are longer than the corresponding conduction paths in the comparative example. Therefore, for the semiconductor device A10, the first elements 31a mounted on the first lower arm mounting layer 211b exhibit the parasitic gate inductance that is higher than the parasitic gate inductance of the corresponding first elements 31a in the comparative example.

In the semiconductor device A10, in addition, the second detection wire 432 that is connected to the second detection terminal 281b is connected to the first lower arm detection layer 214b in a region located between the connection point of the first detection wire 431 corresponding to the element 31a1 and the connection point of the first detection wire 431 corresponding to the element 31a2. Consequently, in the first elements 31a mounted on the first lower arm mounting layer 211b, the parasitic gate inductance is reduced to the values shown in FIG. 23. One reason for this reduction is presumed as follows. In the first detection wires 431 separately connected to the switching elements 31, the emitter current flows in the opposite direction to the gate current flowing through the first gate wires 421. The emitter current flowing through the second detection wire 432 connected to the second detection terminal 281b is larger than the gate current flowing through each first gate wire 421. As shown in FIG. 10, the second detection wire 432 connected to the second detection terminal 281b is in close proximity to the first gate wires 421 connected to the first lower arm gate layer 213b. Thus, the emitter current flowing through the second detection wire 432 creates a magnetic field, which causes mutual induction with the first gate wires 421. This mutual induction presumably causes the reduction in the parasitic gate inductance of the first elements 31a mounted on the first lower arm mounting layer 211b.

As shown in FIG. 23, the parasitic gate inductance of the first elements 31 constituting the lower arm circuit 72 falls within a range of about 20 to 40 nH for the comparative example, and within a range of about 30 to 40 nm for the semiconductor device A10. That is, the variation in parasitic gate inductance is smaller in the semiconductor device A10 than in the comparative example. The same holds with respect to the switching elements 31 constituting the upper arm circuit 71 (see FIG. 21) of the semiconductor device A10 for the following reason. This is, as shown in FIG. 10, the upper arm circuit 71 has the second gate wire 422 and the second detection wire 432 connected to the switching elements 31 in the connection layout that is symmetrical to the connection layout of the lower arm circuit 72 relative to an axis along the first direction x.

In the semiconductor device A10, the lower arm circuit 72 has the second gate wire 422 connected to the second lower arm gate layer 223b as follows. That is, the second gate wire 422 is connected to the second lower arm gate layer 223b at a position between the connection point of the first gate wire 421 nearest to the first substrate 11, which is located opposite the second lower arm gate layer 223b in the first direction x, and the connection point of the first gate wire 421 located next to the nearest first gate wire. That is, the length of the second gate wire 422 is kept to a minimum. Thus, the variation in parasitic gate inductance among the switching elements 31 constituting the lower arm circuit 72 is reduced, without causing excessive increase in the parasitic gate inductance resulting from the second gate wire 422. The same holds with respect to the switching elements 31 constituting the upper arm circuit 71.

In the semiconductor device A10, the lower arm circuit 72 has the second detection wire 432 connected to the first lower arm detection layer 214b as follows. That is, the second detection wire 432 is connected to the first lower arm detection layer 214b at a position between the connection point of the first detection wire 431 nearest to the second substrate 12, which is located opposite the first lower arm detection layer 214b in the first direction x, and the connection point of the first detection wire 431 located next to the nearest first detection wire. That is, the length of the second detection wire 432 is kept to a minimum. Thus, the emitter current flowing through second detection wire 432 does not cause excessive mutual conduction with the first gate wires 421 connected to the first lower arm gate layer 213b. Consequently, the parasitic gate inductance of the first elements 31a mounted on the first lower arm mounting layer 211b is not decreased excessively. The same holds with respect to the switching elements 31 constituting the upper arm circuit 71.

<Other Advantages>

The semiconductor device A10 includes the diodes 32 mounted on the first mounting layers 211 and the second mounting layers 221. The diodes 32 separately correspond to the switching elements 31. That is, each diode 32 is electrically connected to the corresponding switching element 31. Thus, even if a back electromotive force occurs in a switching element 31 when the switching element 31 is driven, the back electromotive force is prevented from flowing any further.

The semiconductor device A10 has the heats ink 51 connected to the first reverse surface 112 of the first substrate 11 and the second reverse surface 122 of the second substrate 12. This configuration achieves efficient dissipation of heat from the switching elements 31 to the outside, facilitating more efficient reduction of the concentration of thermal stress in the first substrate 11 and the second substrate 12.

The semiconductor device A10 has the element current detection terminals 281 electrically connected to the first electrodes 311 of the switching elements 31. Thus, the emitter current flowing through the switching elements 31 can be detected by the element current detection terminals 281. The emitter current thus detected is input to a control circuit external to the semiconductor device A10, enabling the control circuit to block a DC voltage applied to the semiconductor device A10 if an excessive emitter current flows through the switching elements 31. In this way, damage to the switching elements 31 is prevented.

<Variations>

Figure 24:
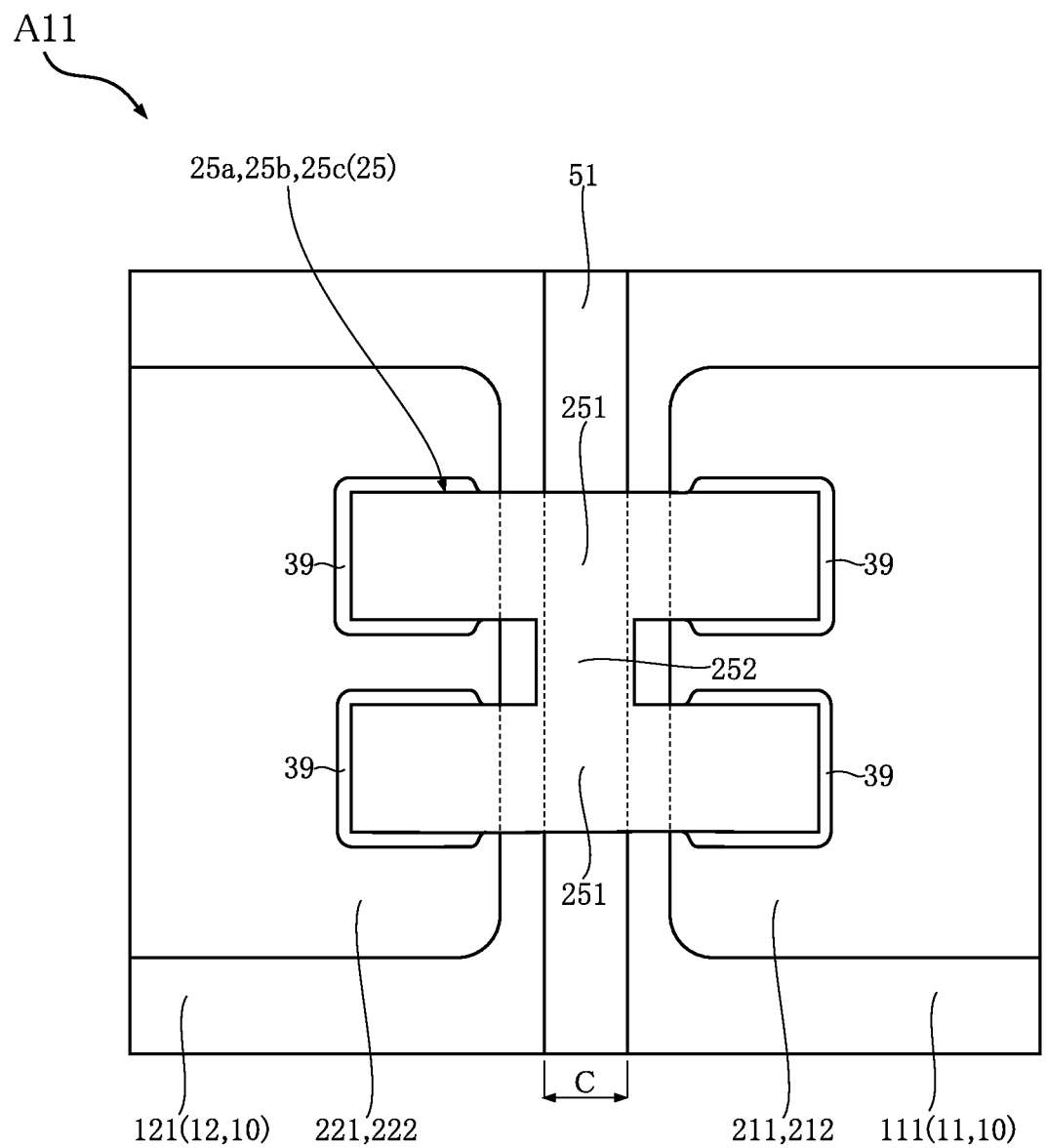
FIG. 24 is an enlarged plan view showing a part (around an electroconductive coupling member) of a semiconductor device according to a variation of the semiconductor device showing in FIG. 1.

With reference to FIG. 24, the following describes a semiconductor device A11 according to a variation of the semiconductor device A10.

The semiconductor device A11 differs from the semiconductor device A10 as to how the electroconductive coupling members 25 are bonded to the first mounting layers 211, the second mounting layers 221, the first electroconductive layers 212 and the second electroconductive layers 222. Each electroconductive coupling member 25 has electroconductive bonding layers 39 via which the strip sections 251 are bonded to the first mounting layer 211 and to the second mounting layer 221 or to the first electroconductive layer 212 and to the second electroconductive layer 222.

Similarly to the semiconductor device A10, the semiconductor device A11 is enabled to carry large electric current and also to reduce the concentration of the thermal stress occurring in the substrates 10.

The present disclosure is not limited to the embodiments described above. Various design changes may be made to the detailed configuration of the elements and components of the present disclosure.

The present disclosure also encompass embodiments according to the following clauses.

[Clause 1A]

A semiconductor device comprising:

a first substrate having a first obverse surface and a first reverse surface each facing in a thickness direction;

a second substrate spaced apart from the first substrate in a first direction perpendicular to the thickness direction, the second substrate having a second obverse surface facing in a direction in which the first obverse surface faces in the thickness direction and a second reverse surface facing away from the second obverse surface;

a plurality of first mounting layers having electrical conductivity and disposed on the first obverse surface;

a plurality of second mounting layers having electrical conductivity and disposed on the second obverse surface;

a plurality of power supply terminals electrically connected to the plurality of first mounting layers;

an output terminal connected to one of the plurality of second mounting layers;

a plurality of electroconductive coupling members separately connected to the plurality of first mounting layers and to the plurality of second mounting layers; and a plurality of switching elements mounted on the plurality of first mounting layers and the plurality of second mounting layers, wherein each of the plurality of electroconductive coupling members has a plurality of strip sections and a connecting section, wherein the plurality of strip sections extend in the first direction and are spaced apart from each other in a second direction perpendicular to both the thickness direction and the first direction, wherein the connecting section extends in the second direction to interconnect the plurality of strip sections, and wherein the plurality of strip sections are connected at one end to the first mounting layer and connected at another end to the second mounting layer.

[Clause 2A]

The semiconductor device according to clause 1A, wherein the power supply terminals, the output terminal and the electroconductive coupling members are each made of a metal plate, wherein the electroconductive coupling members are flat, and wherein a thickness of the electroconductive coupling members is smaller than a thickness of each of the plurality of power supply terminals and the output terminal.

[Clause 3A]

The semiconductor device according to clause 2A, wherein the plurality of strip sections are connected to the first mounting layer and to the second mounting layer by ultrasonic bonding.

[Clause 4A]

The semiconductor device according to clause 2A or 3A, further comprising:

a first electroconductive layer disposed on the first obverse surface and electrically connected to the plurality of switching elements that are mounted on the plurality of first mounting layers; and a second electroconductive layer disposed on the second obverse surface and electrically connected to the plurality of switching elements that are mounted on the plurality of second mounting layers, wherein the first electroconductive layer and the second electroconductive layer are further connected by the electroconductive coupling members, and wherein the plurality of strip sections are connected at one end to the first electroconductive layer and connected at another end to the second electroconductive layer.

[Clause 5A]

The semiconductor device according to clause 4A, wherein the plurality of strip sections are connected to the first electroconductive layer and to the second electroconductive layer by ultrasonic bonding.

[Clause 6A]

The semiconductor device according to clause 5A, wherein the plurality of power supply terminals include a first power supply terminal and a second power supply terminal, wherein the first power supply terminal is connected to one of the plurality of first mounting layers, and wherein the second power supply terminal is connected to the first electroconductive layer.

[Clause 7A]

The semiconductor device according to clause 6A, wherein the output terminal is connected to the one of the plurality of second mounting layers.

[Clause 8A]

The semiconductor device according to clause 7A, further comprising:

a plurality of diodes separately corresponding to the plurality of switching elements and mounted on the plurality of first mounting layers and the plurality of second mounting layers, wherein each of the plurality of diodes is electrically connected to the corresponding switching element.

[Clause 9A]

The semiconductor device according to clause 7A or 8A, further comprising:

a heatsink bonded to both the first reverse surface and the second reverse surface, wherein the first substrate and the second substrate are supported by the heatsink.

[Clause 10A]

The semiconductor device according to clause 9A, further comprising:

a case surrounding the first substrate and the second substrate as viewed in the thickness direction, wherein the power supply terminals, the output terminal and the heatsink are supported by the case.

[Clause 11A]

The semiconductor device according to clause 9A or 10A, wherein the first substrate and the second substrate are made of a material including ceramic.

[Clause 12A]

The semiconductor device according to clause 10A or 11A, wherein each of the plurality of switching elements includes: a first electrode and a gate electrode disposed on a side the first obverse surface faces in the thickness direction; and a second electrode disposed on a side the first reverse surface faces in the thickness direction, and wherein the plurality of second electrodes are electrically connected to the plurality of first mounting layers and the plurality of second mounting layers.

[Clause 13A]

The semiconductor device according to clause 12A, further comprising:

a plurality of first gate layers disposed on the first obverse surface and electrically connected to the gate electrodes of the plurality of switching elements that are mounted on the plurality of first mounting layers;

a plurality of second gate layers disposed on the second obverse surface and electrically connected to the gate electrodes of the plurality of switching elements that are mounted on the plurality of second mounting layers;

a plurality of first conductive members separately connected to the plurality of first gate layers and to the plurality of second gate layers; and a plurality of gate terminals electrically connected to one of the plurality of first gate layers and the plurality of second gate layers, wherein the plurality of gate terminals are supported by the case.

[Clause 14A]

The semiconductor device according to clause 13A, further comprising:

a plurality of first detection layers disposed on the first obverse surface and electrically connected to the first electrodes of the plurality of switching elements that are mounted on the plurality of first mounting layers;

a plurality of second detection layers disposed on the second obverse surface and electrically connected to the first electrodes of the plurality of switching elements mounted on the plurality of second mounting layers;

a plurality of second conductive members separately connected to the plurality of first detection layers and to the plurality of second detection layers; and a plurality of element current detection terminals connected to one of the plurality of first and second detection layers, wherein the plurality of element current detection terminals are supported by the case.

[Clause 1B]

A semiconductor device comprising:

a pair of substrates having an obverse surface facing in a thickness direction, the pair of substrates being spaced apart from each other in a first direction perpendicular to the thickness direction;

a pair of electroconductive mounting layers separately disposed on the pair of obverse surfaces;

a pair of gate layers separately disposed on the pair of obverse surfaces to extend in the first direction;

a pair of detection layers separately disposed on the pair of obverse surfaces to extend in the first direction;

a first electroconductive member extending in the first direction and connecting the pair of gate layers;

a second electroconductive member extending in the first direction and connecting the pair of detection layers;

a plurality of switching elements having a gate electrode and a first electrode and disposed along the first direction on the pair of mounting layers;

a plurality of first gate wires separately connected, in each of the paired substrates, to the gate layer and to the plurality of gate electrodes;

a plurality of first detection wires separately connected, in each of the paired substrates, to the detection layer and to the plurality of first electrodes;

a gate terminal and an element current detection terminal disposed adjacent to each other and opposite one of the substrates in a second direction perpendicular to both the thickness direction and the first direction;

a second gate wire connected at one end to the gate terminal; and a second detection wire connected at one end to the element current detection terminal, wherein another end the second detection wire is connected to the detection layer that is disposed on one of the substrates, and wherein another end of the second gate wire is connected to the gate layer that is disposed on another one of the substrates.

[Clause 2B]

The semiconductor device according to clause 1B, wherein in the gate layer to which the second gate wire is connected, the second gate wire is connected to the gate layer at a position between a connection point of one of the first gate wires nearest to the substrate disposed opposite the gate layer in the first direction and a connection point of one of the first gate wires located next to the nearest first gate wire.

[Clause 3B]

The semiconductor device according to clause 2B, wherein in the detection to which the second detection wire is connected, the second detection wire is connected to the detection wire at a position between a connection point of one of the first detection wires nearest to the substrate disposed opposite the detection layer in the first direction and a connection point of one of the second detection wires located next to the nearest second detection wire.

[Clause 4B]

The semiconductor device according to any one of clauses 1B to 3B, each of the first electroconductive member and the second electroconductive member comprises a plurality of metal wires.

The invention claimed is:

1. A semiconductor device comprising:
a first substrate having a first obverse surface and a first reverse surface each facing in a thickness direction;
a second substrate spaced apart from the first substrate in a first direction perpendicular to the thickness direction, the second substrate having a second obverse surface facing in a direction in which the first obverse surface faces in the thickness direction and a second reverse surface facing away from the second obverse surface;
a plurality of first mounting layers having electrical conductivity and disposed on the first obverse surface;
a plurality of second mounting layers having electrical conductivity and disposed on the second obverse surface;
a plurality of power supply terminals electrically connected to the plurality of first mounting layers;
an output terminal connected to one of the plurality of second mounting layers;
a plurality of electroconductive coupling members separately connected to the plurality of first mounting layers and to the plurality of second mounting layers; and
a plurality of switching elements mounted on the plurality of first mounting layers and the plurality of second mounting layers,
wherein each of the plurality of electroconductive coupling members has a plurality of strip sections and a connecting section,
wherein the plurality of strip sections extend in the first direction and are spaced apart from each other in a second direction perpendicular to both the thickness direction and the first direction, wherein the connecting section extends in the second direction to interconnect the plurality of strip sections, and wherein the plurality of strip sections are connected at one end to the first mounting layer and connected at another end to the second mounting layer.

2. The semiconductor device according to claim 1, wherein the power supply terminals, the output terminal and the electroconductive coupling members are each made of a metal plate, wherein the electroconductive coupling members are flat, and wherein a thickness of the electroconductive coupling members is smaller than a thickness of each of the plurality of power supply terminals and the output terminal.

3. The semiconductor device according to claim 2, wherein the plurality of strip sections are connected to the first mounting layer and to the second mounting layer by ultrasonic bonding.

4. The semiconductor device according to claim 2, further comprising:

a first electroconductive layer disposed on the first obverse surface and electrically connected to the plurality of switching elements that are mounted on the plurality of first mounting layers; and a second electroconductive layer disposed on the second obverse surface and electrically connected to the plurality of switching elements that are mounted on the plurality of second mounting layers, wherein the first electroconductive layer and the second electroconductive layer are further connected by the electroconductive coupling members, and wherein the plurality of strip sections are connected at one end to the first electroconductive layer and connected at another end to the second electroconductive layer.

5. The semiconductor device according to claim 4, wherein the plurality of strip sections are connected to the first electroconductive layer and to the second electroconductive layer by ultrasonic bonding.

6. The semiconductor device according to claim 5, wherein the plurality of power supply terminals include a first power supply terminal and a second power supply terminal, wherein the first power supply terminal is connected to one of the plurality of first mounting layers, and wherein the second power supply terminal is connected to the first electroconductive layer.

7. The semiconductor device according to claim 6, wherein the output terminal is connected to the one of the plurality of second mounting layers.

8. The semiconductor device according to claim 7, further comprising: a plurality of diodes separately corresponding to the plurality of switching elements and mounted on the plurality of first mounting layers and the plurality of second mounting layers, wherein each of the plurality of diodes is electrically connected to the corresponding switching element.

9. The semiconductor device according to claim 7, further comprising:

a heatsink bonded to both the first reverse surface and the second reverse surface, wherein the first substrate and the second substrate are supported by the heatsink.

10. The semiconductor device according to claim 9, further comprising:

a case surrounding the first substrate and the second substrate as viewed in the thickness direction, wherein the power supply terminals, the output terminal and the heatsink are supported by the case.

11. The semiconductor device according to claim 10, wherein the first substrate and the second substrate are made of a material including ceramic.

12. The semiconductor device according to claim 10, wherein each of the plurality of switching elements includes: a first electrode and a gate electrode disposed on a side which the first obverse surface faces in the thickness direction; and a second electrode disposed on a side which the first reverse surface faces in the thickness direction, and wherein the plurality of second electrodes are electrically connected to the plurality of first mounting layers and the plurality of second mounting layers.

13. The semiconductor device according to claim 12, further comprising:

a plurality of first gate layers disposed on the first obverse surface and electrically connected to the gate electrodes of the plurality of switching elements that are mounted on the plurality of first mounting layers;

a plurality of second gate layers disposed on the second obverse surface and electrically connected to the gate electrodes of the plurality of switching elements that are mounted on the plurality of second mounting layers;

a plurality of first conductive members separately connected to the plurality of first gate layers and to the plurality of second gate layers; and a plurality of gate terminals electrically connected to one of the plurality of first gate layers and the plurality of second gate layers, wherein the plurality of gate terminals are supported by the case.

14. The semiconductor device according to claim 13, further comprising:

a plurality of first detection layers disposed on the first obverse surface and electrically connected to the first electrodes of the plurality of switching elements that are mounted on the plurality of first mounting layers;

a plurality of second detection layers disposed on the second obverse surface and electrically connected to the first electrodes of the plurality of switching elements mounted on the plurality of second mounting layers;

a plurality of second conductive members separately connected to the plurality of first detection layers and to the plurality of second detection layers; and a plurality of element current detection terminals connected to one of the plurality of first and second detection layers, wherein the plurality of element current detection terminals are supported by the case.

15. The semiconductor device according to claim 1, wherein each strip section in each electroconductive coupling member has a reference rectangular region defined by a first edge extending in the first direction and a second edge extending in the second direction, said each strip section includes: a first bulging portion bulging in the first direction with respect to the second edge with a first maximum distance; and a second bulging portion bulging in the second direction with respect to the first edge with a second maximum distance, the first maximum distance is greater than the second maximum distance.

16. The semiconductor device according to claim 1, wherein each strip section in each electroconductive coupling member has connection regions spaced apart from each other in the first direction, and each of the connection regions is formed with a plurality of projections.

17. The semiconductor device according to claim 16, wherein the plurality of projections in each connection region are arranged in a mesh pattern as viewed in the thickness direction.

* * * * *